(12) United States Patent
Smith

(10) Patent No.: US 6,791,667 B2
(45) Date of Patent: Sep. 14, 2004

(54) ILLUMINATION DEVICE FOR PROJECTION SYSTEM AND METHOD FOR FABRICATING

(75) Inventor: Bruce W. Smith, Webster, NY (US)

(73) Assignee: ASML Netherlands B.V., Veldhoven (NL)

( * ) Notice: Subject to any disclaimer, the term of this patent is extended or adjusted under 35 U.S.C. 154(b) by 2 days.

(21) Appl. No.: 10/092,483

(22) Filed: Mar. 8, 2002

(65) Prior Publication Data

US 2002/0145720 A1 Oct. 10, 2002

Related U.S. Application Data

(62) Division of application No. 09/422,398, filed on Oct. 21, 1999.
(60) Provisional application No. 60/105,281, filed on Oct. 22, 1998, and provisional application No. 60/119,780, filed on Feb. 11, 1999.

(51) Int. Cl.[7] ............................ G03B 27/72; G03B 27/42
(52) U.S. Cl. ............................................. 355/71; 355/53
(58) Field of Search ........................ 355/53, 55, 67–71; 430/5, 20, 22, 30, 311; 382/237

(56) References Cited

U.S. PATENT DOCUMENTS

| | | | |
|---|---|---|---|
| 3,729,252 A | 4/1973 | Nelson | |
| 3,776,633 A | 12/1973 | Frosch et al. | |
| 4,970,586 A | * 11/1990 | Sunda et al. | 358/75 |
| 5,305,054 A | 4/1994 | Suzuki et al. | |
| 5,627,625 A | 5/1997 | Ogawa | |
| 5,631,721 A | 5/1997 | Stanton et al. | |
| 5,638,211 A | 6/1997 | Shiraishi | |
| 5,673,102 A | 9/1997 | Suzuki et al. | |
| 5,926,257 A | 7/1999 | Mizouchi | |
| 5,953,459 A | * 9/1999 | Ueda et al. | 382/237 |
| 6,356,340 B1 | * 3/2002 | Spence | 355/53 |

FOREIGN PATENT DOCUMENTS

| | | |
|---|---|---|
| EP | 0 503 472 A3 | 9/1962 |
| EP | 0 486 316 A3 | 5/1992 |
| EP | 0 496 891 A1 | 8/1992 |
| EP | 0 500 393 A3 | 8/1992 |
| EP | 0 500 393 B1 | 8/1992 |
| EP | 0 783 135 A1 | 7/1997 |

OTHER PUBLICATIONS

S. Asai, et al., "High Performance Optical Lithography Using a Separated Light Source", *J. Vac. Sci. Technology*, vol. B 10(6), pp. 3023–3026, (Nov./Dec. 1992).

E. Tamechika, et al.,"Investigation of Single Sideband Optical Lithography Using Oblique Incidence Illumination", *J. Vac. Sci. Technology*, vol. B 10(6), pp. 3027–3031, (Nov./Dec. 1992).

(List continued on next page.)

*Primary Examiner*—Henry Hung Nguyen
(74) *Attorney, Agent, or Firm*—Pillsbury Winthrop LLP

(57) ABSTRACT

A masking aperture for a photomask illumination system provides controlled on-axis and off-axis illumination. The masking aperture has a dithered pattern of pixels. The intensity of the pattern controls the illumination of the photomask. The masking aperture pattern defines one or more zones of illumination. Zones comprise elements that are patterned in accordance with a selected wavelength of incident light to diffract the incident light into an illumination pattern for illuminating a photomask. Each of the elements is constructed with a matrix of pixels. In the preferred embodiment the array of pixels is 8×8. The number of elements is generally greater than 3×3.

24 Claims, 24 Drawing Sheets

OTHER PUBLICATIONS

W.N. Partlow, et al., "Depth of Focus and Resolution Enhancement for i-line and Deep-UV Lithography Using Annular Illumination", *SPIE Optical/Laser Microlithography*, vol. 1927, pp. 137–156, (1993).

T. Ogawa, et al.,"The Effective Light Source Optimization With the Modified Beam For the Depth-of-Focus Enhancements", *SPIE Optical Laser Microlithography*, vol. 2197, pp. 19–30, (1994).

T. Ogawa, et al.,"Sub–Quarter Micron Optical Lithogrpahy With Practical Super Resolution Technique", *SPIE Optical Laser Microlithography VIII*, vol. 2440, pp. 772–783, (1995).

B. W. Smith, et al.,"Illumination Pupil Filtering Using Modified Quadrupole Apertures", *SPIE Optical Microlighography XI*, vol. 3334, pp. 37–47, (1998).

B.W. Smith, et al., "Influences of Off–Axis Illumination on Optical Lens Aberration", *J. Vac. Sci. Technology*, vol. B16(6) 3398, pp. 3405–3410, (Nov./Dec. 1998).

Chin C. Hsia, et al., "Customized Off–Axis Illumination Aperture Filtering for Sub 0.18 um KrF Lithography", *SPIE Optical Microlithography XI*, vol. 3679, pp. 39–46, (1999).

P. Zandbergen, et al., "Optical Extension at the 193nm Wavelength", *SPIE Optical Microlithography XI*, vol. 3679, pp. 29–38, (1999).

Z. Yang, et al., "Corrections of Aberrations Using HOE's in UV and Visible Imaging Systems", *SPIE International Lens Deisgn Conference*, vol. 1354, pp. 323–327, (1990).

B. W. Smith, *Microlithography: Science and Technology*, Chapter 3, New York: Marcel Dekker (1998), pp. 216–231.

* cited by examiner

ILLUMINATION DEVICE FOR PROJECTION SYSTEM AND METHOD FOR FABRICATING

CROSS-REFERENCE TO RELATED APPLICATIONS

The present application is a division of U.S. patent application Ser. No. 09/422,398, filed Oct. 21, 1999, which claims the benefit of the priority date of the following U.S. Provisional Application No. 60/105,281 filed Oct. 22, 1998 and No. 60/119,780, filed Feb. 11, 1999, each of which applications are hereby incorporated in their entirety into the present application by reference.

Reference is also made to co-pending application entitled "Illumination Device for Projection System and Method for Fabricating," being filed concurrently herewith and hereby incorporated in its entirety into the present application by reference.

BACKGROUND OF THE INVENTION

Optical lithography has been one of the principal driving forces behind the continual improvements in the size and performance of the integrated circuit (IC) since its inception. Feature resolution down to 0.30 μm is now routine using the 365 nm mercury (Hg) i-line wavelength and optical projection tools operating at numerical apertures above 0.55 with aberration levels below 0.05λ RMS OPD. The industry is at a point where resolution is limited for current optical lithographic technologies. In order to extend capabilities toward sub-0.25 μm, modifications in source wavelength, optics, illumination, masking, and process technology are required and are getting very much attention.

However, as devices get smaller, the photomask pattern becomes finer. Fine patterns diffract light and thus detract from imaging the photomask onto the surface of a wafer. FIG. 1a shows what happens when a photomask with a fine pattern 6 having a high frequency (pitch 2d is about several microns), is illuminated through a projection lens system 7. The fine pattern 6 is illuminated along a direction perpendicular to the surface thereof and it diffracts the light that passes through the mask 6. Diffraction rays 3–5 caused by the pattern include a zero-th order diffraction ray 4 directed in the same direction as the direction of advancement of the input ray, and higher order diffraction rays such as positive and negative first order diffraction rays 3, 5, for example, directed in directions different from the input ray. Among these diffraction rays, those of particular diffraction orders such as, for example the zero-th order diffraction ray and positive and negative first order diffraction rays 3, 5, are incident on a pupil 1 of the projection lens system 7. Then, after passing through the pupil 1, these rays are directed to an image plane of the projection lens system, whereby an image of the fine pattern 6 is formed on the image plane. In this type of image formation, the ray components which are contributable to the contrast of the image are higher order diffraction rays. If the frequency of a fine pattern increases, it raises a problem that an optical system does not receive higher order diffraction rays. Therefore, the contrast of the image degrades and, ultimately, the imaging itself becomes unattainable.

As will be shown below, some solutions to this problem rely upon shaping the rays of light impinging the photomask in order to provide off-axis illumination to compensate for the lost contrast due to diffraction. These techniques rely upon optical systems for shaping the rays that illuminate the photomask.

In considering potential strategies for sub-0.25 μm lithography, the identification of purely optical issues is difficult. Historically, the Rayleigh criteria for resolution (R) and depth of focus (DOF) has been utilized to evaluate the performance of a given technology:

$$R = k_1 \lambda / NA$$

$$DOF = +/- k_2 \lambda / NA^2$$

where $k_1$ and $k_2$ are process dependent factors, λ is wavelength, and NA is numerical aperture. As wavelength is decreased and numerical aperture is increased, resolution capability improves. Considered along with the wavelength-linear and NA-quadratic loss in focal depth, reasonable estimates can be made for system performance. Innovations in lithography systems, materials and processes that are capable of producing improvements in resolution, focal depth, field size, and process performance are those that are considered most practical.

The Hg lamp is a source well suited for photolithography and is relied on almost entirely for production of radiation in the 350–450 nm range. Excimer lasers using argon fluoride (ArF) and krypton fluoride (KrF), which produce radiation at 193 nm and 248 nm, respectively, are also used. DUV lithography at 248 nm is now being implemented into manufacturing operations and may be capable of resolution to 0.18 μm.

The control of the relative size of the illumination system numerical aperture has historically been used to optimize the performance of a lithographic projection tool. Control of this NA with respect to the projection systems objective lens NA allows for modification of spatial coherence at the mask plane, commonly referred to partial coherence. This is accomplished through specification of the condenser lens pupil size with respect to the projection lens pupil in a Köhler illumination system. Essentially, this allows for manipulation of the optical processing of diffraction information. Optimization of the partial coherence of a projection imaging system is conventionally accomplished using full circular illuminator apertures. By controlling the distribution of diffraction information in the objective lens with the illuminator pupil size, maximum image modulation can be obtained. Illumination systems can be further refined by considering variations to full circular illumination apertures. A system where illumination is obliquely incident on the mask at an angle so that the zero-th and first diffraction orders are distributed on alternative sides of the optical axis may allow for improvements. Such an approach is generally referred to as off-axis illumination. The resulting two diffraction orders can be sufficient for imaging. The minimum pitch resolution possible for this oblique condition of partially coherent illumination is 0.5λ/NA, one half that possible for conventional illumination. This is accomplished by limiting illumination to two narrow beams, distributed at selected angles. The illumination angle is chosen uniquely for a given wavelength (λ), numerical aperture (NA), and feature pitch (d) and can be calculated for dense features as $\sin^{-1}(0.5\lambda/d)$ for NA=0.5λ/d. The most significant impact of off axis illumination is realized when considering focal depth. In this case, the zero-th and 1st diffraction orders travel an identical path length regardless of the defocus amount. The consequence is a depth of focus that is effectively infinite.

In practice, limiting illumination to allow for one narrow beam or pair of beams leads to zero intensity. Also, imaging is limited to features oriented along one direction in an x-y plane. To overcome this, an annular or ring aperture has been employed that delivers illumination at angles needed with a finite ring width to allow for some finite intensity. The resulting focal depth is less than that for the ideal case, but improvement over a full circular aperture can be achieved. For most integrated circuit application, features are limited to horizontal and vertical orientation, and a four-zone configuration may be more suitable. Here, zones are at diagonal positions oriented 45 degrees to horizontal and vertical mask features. Each beam is off-axis to all mask features, and minimal image degradation exists. Either the annular or the four-zone off-axis system can be optimized for a specific feature size, which would provide non-optimal illumination for all others. For features other than those that are targeted and optimized for, higher frequency components do not overlap, and additional spatial frequency artifacts are introduced. This can lead to a possible degradation of imaging performance.

When considering dense features (1:1 to 1:3 line to space duty ratio), modulation and focal depth improvement can be realized through proper choice of illumination configuration and angle. For true isolated features, however, discrete diffraction orders would not exist; instead a continuous diffraction pattern is produced. Convolving such a frequency representation with either illumination zones or annular rings would result in diffraction information distributed over a range of angles. Truly isolated line performance is, therefore, not improved with off-axis illumination. When features are not completely isolated but have low density (>1:3 line to space duty ratio), the condition for optimum illumination will not be optimal for more dense features. Furthermore, the use of off-axis illumination is generally not required for the large pitch values that correspond to low density geometry. As dense and mostly isolated features are considered together in a field, it follows that the impact of off-axis illumination on these features will differ, and a large disparity in dense to isolated feature performance can result.

One approach to generate off-axis illumination is to incorporate a metal aperture plate filter into the fly eye lens assembly of the projection system illuminator providing oblique illumination. A pattern on such a metal plate would have four quadruple openings (zones) with sizing and spacing set to allow diffraction order overlap for specific geometry sizing and duty ratio on the photomask, as disclosed in JP patent Laid-Open (KOKAI) Publication No.4-267515. Such an approach results in a significant loss in intensity available to the mask, lowering throughput and making the approach less than desirable. Additionally, the four circular openings need to be designed specifically for certain mask geometry and pitch and would not improve the performance of other geometry sizes and spacings. Large levels of mask biasing or mask optical proximity correction (OPC), where mask features are pre-distorted to produce desired image characteristics, would be required to allow for use of this approach with a variety of features. Filtering, by limiting its effective area, reduces the effect of the fly eye diffuser on maximizing illumination uniformity. Illumination uniformity may be degraded. This approach also limits the illumination profile to one having holes in a metal plate. That is, the masking metal must remain contiguous. The previous work in this area describes such methods using either two or four openings in the aperture plate: EP0500393, U.S. Pat. Nos. 5,305,054, 5,673,103, 5,638,211, EP0496891, EP0486316, U.S. Pat. No. 37,9252.

Another approach to off-axis illumination using the four-zone configuration, which is disclosed in U.S. Pat. No. 5,627,625, is to divide the illumination field of the projection system into beams that can be shaped to distribute off-axis illumination to the photomask. By incorporating the ability to shape off-axis illumination, throughput and flexibility of the exposure source is maintained. Additionally, this approach allows for illumination that combines off-axis and on-axis (conventional) characteristics. By doing so, the improvement to dense features that are targeted with off-axis illumination is less significant than straight off-axis illumination. The performance of less dense features, however, is more optimal because of the more preferred on-axis illumination for these features. The result is a reduction in the optical proximity effect between dense and isolated features. Optimization is less dependent on feature geometry and more universal illumination conditions can be selected.

A problem with this divided illumination approach is that it requires reconfiguration of the illumination system of a projection tool, a task that is not practical on existing tools or systems designed with other illumination systems. Additionally, the use of divided beam illumination limits the fine control of beam shape, size, and position to that which is possible with optical components utilized in the system. Variations in shape, size, position, number of beams, maximum aperture size, or other feature or lens specific variations to the illumination intensity profile become difficult without significant mechanical modifications. Some variations may not be practical or possible with this approach. This has significantly limited the acceptance or use of this approach in most integrated circuit fabrication operations.

SUMMARY OF THE INVENTION

A shaped illumination approach is described that allows for off-axis illumination of a photomask in a projection exposure tool. It is necessary to control both the off-axis and the on-axis character of the illumination for instance so that dense line performance can be improved and more isolated line performance can be maintained, i.e., optical proximity effect (hereinafter "OPE") is kept to a minimum. Minimal OPE correction is desired to reduce mask complexity. There is also a desire for a flexible technique that can be incorporated into most existing or future generation projection exposure tools with a minimum amount of illumination system retrofitting. It is important that such an improvement be easily removed to allow a return to original operation conditions since it is expected that a given projection exposure system would be used for a variety of applications. Such an approach can lead to optimizing illumination conditions, which can be incorporated into an exposure system as a more permanent condition. The invention also provides an improvement that allows for fine adjustment or modification to accommodate mask-specific or lens-specific characteristics is important as resolution and focal depth requirement are pushed beyond the capability of conventional optical lithography. Maintaining illumination throughput is also critical, as any loss in intensity will result in increased exposure time requirements.

The invention provides such a solution. It modifies existing illumination system by adding a masking aperture in the illumination pupil plane, fabricated as an optical component reticle, patterned and dithered into a large number of elements to allow for control of the projected light distribution at the mask plane and inserted at the condenser lens pupil plane. This masking aperture comprises a translucent substrate and a masking film. The distribution of the intensity through the masking aperture in the illumination pupil plane, is determined to provide optimized illumination. The illumination region or regions exhibit varying intensity, which is accomplished by creating a half-tone pattern via pixelation of the masking film, thereby allowing for maximum variation in illumination beyond the simple binary (clear or opaque) possible with earlier pupil plane filtering approaches.

More specifically, the invention includes an aperture mask for an illumination system to provide controlled on-axis and off-axis illumination. The aperture mask acts as a diffraction element. The aperture mask is divided into an array of elements and each element contains an array of pixels. Each of the elements is constructed with a matrix of pixels. In the preferred embodiment the array of pixels is 8×8. The number of elements in the illumination array are generally larger than 3×3 and array sizes of 21×21 and 51×51 are an example, which correspond to 441 and 2601 elements respectively. The elements are patterned in accordance with a selected wavelength of incident light to diffract the incident light into an illumination pattern for illuminating a photomask.

The intensity is modulated by the intensity state of pixels within each element. The highest intensity element has all pixels clear or maximum intensity. Light of suitable wavelength passes through without attenuation. An element with 64 pixels having dark or minimum intensity attenuates or blocks all light. Elements of intensity between none (0%) and all (100%) are created by the state of the pixels in a given element. Random patterns and other patterns between elements may produce artifacts similar to moire patterns. Such artifacts are undesired. I discovered that a dithered pattern using position dependent thresholds produced illumination patterns that had little or no artifacts.

I also discovered that traditional, optical shaping systems such as beam-splitters or diffractive optical elements and my diffraction shaping system can each be improved by adding an illumination aperture. A square illumination aperture shows maximum improvement. It is located at or near the pupil of the illumination system. An aperture with a large, central square opening and an opaque border is inserted at the condenser lens pupil proximate to the fly's eye lens. It can also be designed into the masking aperture. The resulting illumination pattern fills the corners and squares the edges of the illumination pupil and limits the non-optimal frequency spreading character along the x and y axes while optimizing the off-axis illumination angles. The square illumination aperture is especially helpful for imaging features that are oriented along x and y directions in the mask plane. The use of a central obscuration (square and also round shaped) applied in the same location can similarly be achieved and can lead to performance improvements described hereinafter. Furthermore, any combination of off-axis illumination with a square pupil or obscuration has potential to improve performance for geometry oriented in the x-y direction. This can include, but is not limited to, round zones, elliptical zones, square zones, and annular slots (that is an annular ring masked off on x and y axis to form arc-shaped zones).

BRIEF DESCRIPTION OF THE DRAWINGS

FIG. 1a 1 is a schematic view of an illumination system for a photomask.

DETAILED DESCRIPTION OF THE INVENTION

For given ranges of feature types and/or sizes (types being lines, spaces, contacts, and dense or isolated combinations of these) exposure conditions are optimized by determining the average off-axis angle to accommodate all features. The distribution of off-axis angles is then determined based on the range of feature sizes of interest. As the range of feature sizes increases, the condition of off-axis illumination approaches a limit equivalent to the on-axis condition. Most commonly, duty ratios for a given feature size may range from 1:1 to 1:6 line:space ratio. The spread of off-axis illumination angles is accomplished by shaping zones (for the two or more zone, including four-zone) or rings (for the annular) to produce continuous intensity distributions.

Figure 1A:
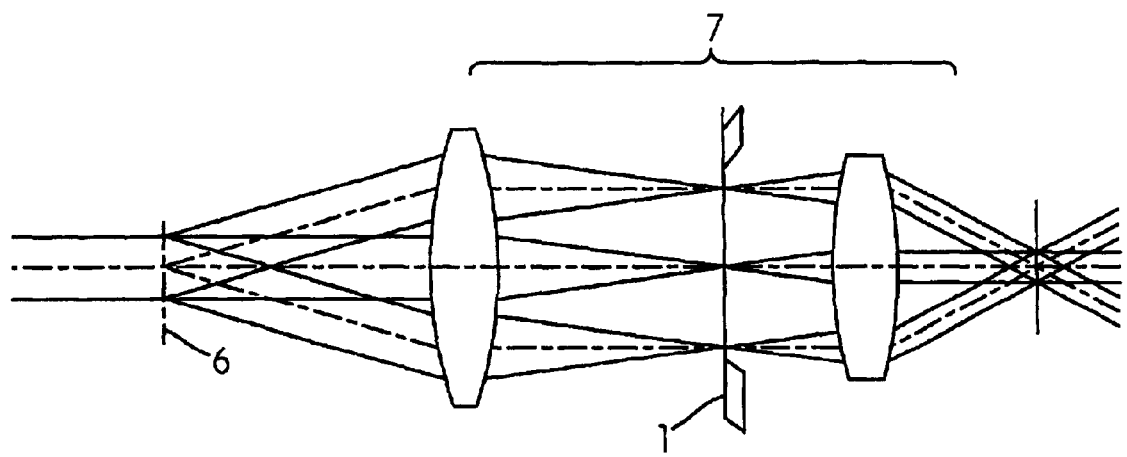
Figure 1B:
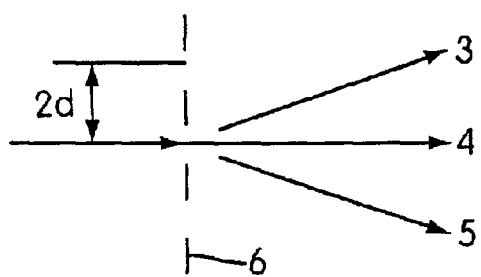
FIG. 1b shows the zero-th and first positive and first negative diffraction rays.
Figure 1C:
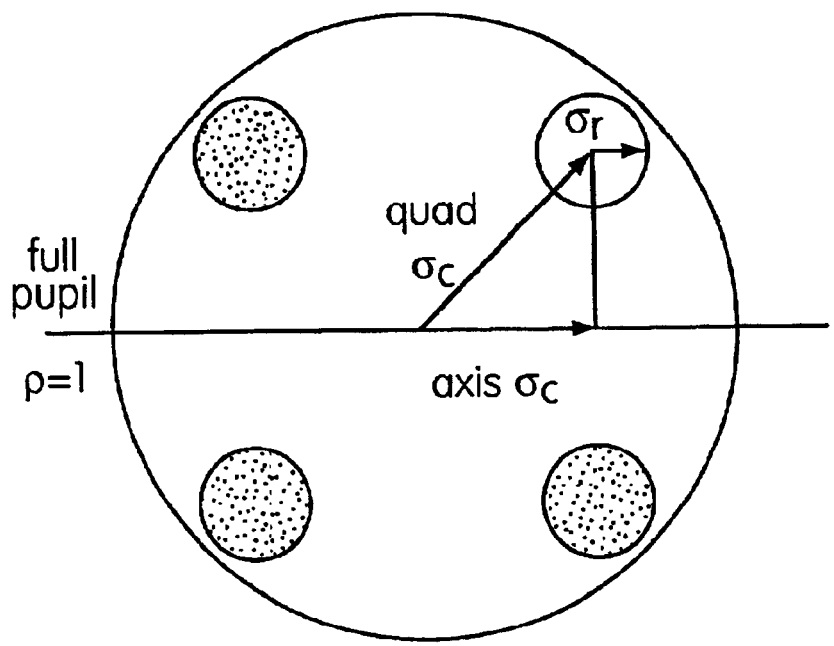
FIG. 1c is a schematic view of a four-zone illumination arrangement.

As an example of the design considerations, 130 nm features are considered using a 193 nm exposure wavelength and a 0.60 objective lens numerical aperture. Duty ratios from 1:1 to 1:6 are included. Features are considered dense with a duty ratio less than 1:3. Table 1 shows the pitch values (p) for these dense features, along with the required axis center sigma and four-zone center sigma ($\sigma_c$) values for optimum off-axis illumination. Center sigma values on axis are determined as $\lambda/(2p \cdot NA)$, as shown in FIG. 1. Since diffraction order placement is determined by the projection of the four-zone onto the x or y axis, the center four-zone sigma values are larger by a $(2)^{1/2}$ factor.

In order to design an off-axis illumination configuration that can accommodate and enhance the range of pitch values in Table 1, zone position and radius values must be chosen so that some amount of order overlap occurs for each case. This can be accomplished if the four-zone center $\sigma_c$ and the radius $\sigma_r$ values are set as follows:

$\sigma_c = SQRT(2)*(0.61+0.35)/2=0.68$ $\sigma_r > (0.61-0.35)/2=0.13$

Figure 2:
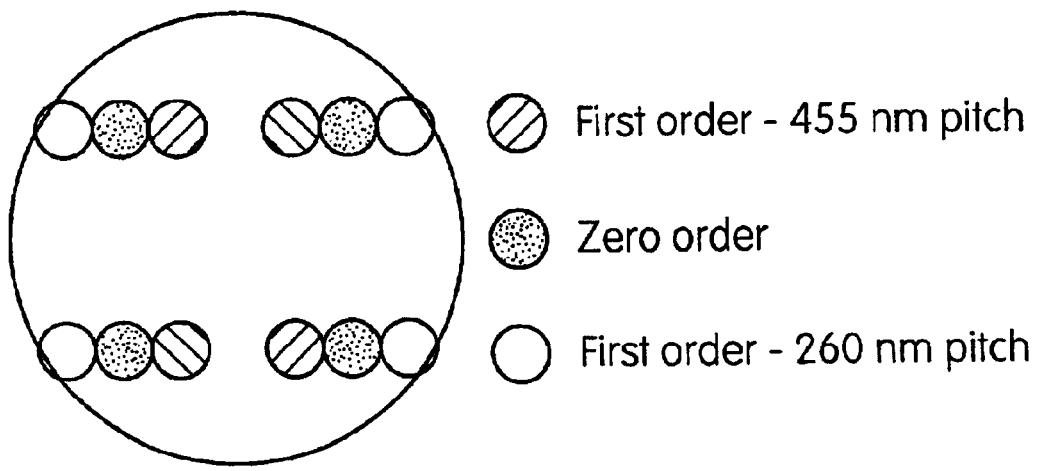
FIG. 2 is a drawing showing diffraction orders (first and zero) for 130 mn x-oriented features using four-zone illumination, plotted in the frequency plane of the objective lens. Center sigma is 0.68 and radius sigma is 0.13, chosen to accommodate feature pitch values from 260 to 455 nm.

These choices for zone center and radius values correspond to the situation where zero and first diffraction orders begin to overlap for the extreme pitch values of 260 and 455 nm, as shown in FIG. 2. The $(2)^{1/2}$ term does not factor into determination of $\sigma_r$ values since the zone radius is projected directly onto the axes. The extent of order overlap for these extreme pitch values is, however, mostly ineffectual, and larger $\sigma_r$ values are required to influence performance. A $\sigma_r$ value of 0.20 allows for significant order overlap (~20%) and is a more practical starting value for further optimization.

Figure 3:
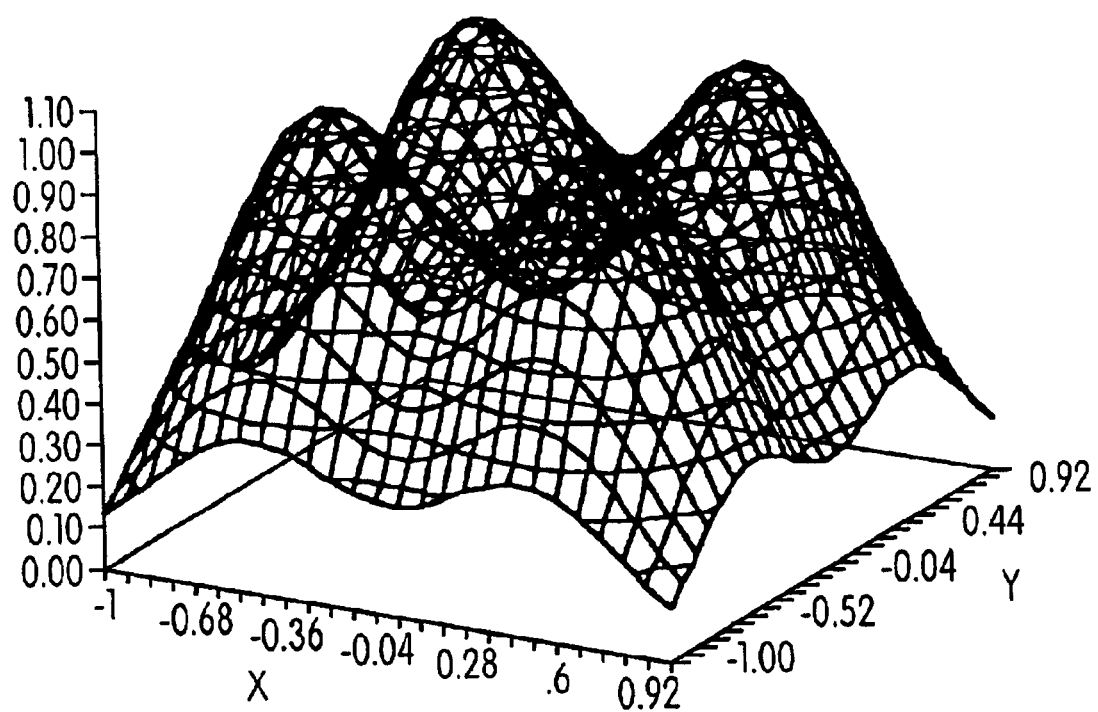
FIG. 3 is a drawing of the continuous tone intensity distribution for a masking aperture based on four distributed-intensity zones.

When imaging of both dense and isolated features, illumination that resembles both the strong four-zone and the conventional on-axis illumination is desirable. This can lead, for instance, to the four-zone illumination design where circular zones are replaced with continuous tone zones, as shown in FIG. 3.

TABLE 1

Pitch and sigma values for 130 nm features and 1:1 to 1:2.5 duty ratios.

| Duty | Pitch (nm) | axis sigma | four-zone sigma |
|---|---|---|---|
| 1:1 | 260 | 0.61 | 0.87 |
| 1:1.5 | 325 | 0.50 | 0.71 |
| 1:2 | 390 | 0.42 | 0.59 |
| 1:2.5 | 455 | 0.35 | 0.49 |

The masking aperture of this invention is a bilevel representation of the desired intensity distribution in the illuminator. It is desired to resemble a near continuously varying transition from open to opaque areas. To achieve this result, the illumination pattern is divided into a large number of elements and each element is a matrix of pixels. Dithering or pixelation of the continuous distribution of intensity is used for translation to the binary or bilevel masking aperture. The element array is large, consisting of, for instance, 5×5, 7×7, 9×9, 11×11, 21×21 or 51×51 elements, but not limited to these cases. The illumination profile is divided into such an element array. Individual masking pixels are small, on the order of 10 to 100 μm, and are either translucent or opaque. Their size is dependent on the size of the physical masking aperture. The continuous tone nature of the illumination intensity profile is translated by controlling the spatial density of the bilevel display states on the masking aperture. Several decision rules may be implemented to produce the output distribution on the masking aperture. A fixed threshold technique is simplest in form, but an ordered dithering approach may be used to most effectively translate a continuous tone intensity profile into a bilevel masking aperture representation. Intensity values are compared to a position-dependent set of threshold values, contained in a n×n dither matrix. A set of selection rules repeats the dither matrix in a checkerboard arrangement over the illumination field. One key to this approach is the generation of a bilevel representation of the continuous tone image with the minimal amount of low spatial frequency noise. In other words, the occurrence of texture, granularity, or other artifacts is reduced to a minimum, allowing for the critical control of illumination uniformity demanded in projection exposure tools.

The resulting bilevel representation of the continuous tone off-axis and/or on-axis illumination profile is then suitable for recording into a photo-sensitive or electron beam-sensitive resist material through use of mask pattern generator. Other approaches might use lithographic techniques common to lithographic or printing technologies. Such a resist material, when coated over an opaque film on translucent substrate, can allow for pattern delineation and creation of the masking aperture.

Figure 4:
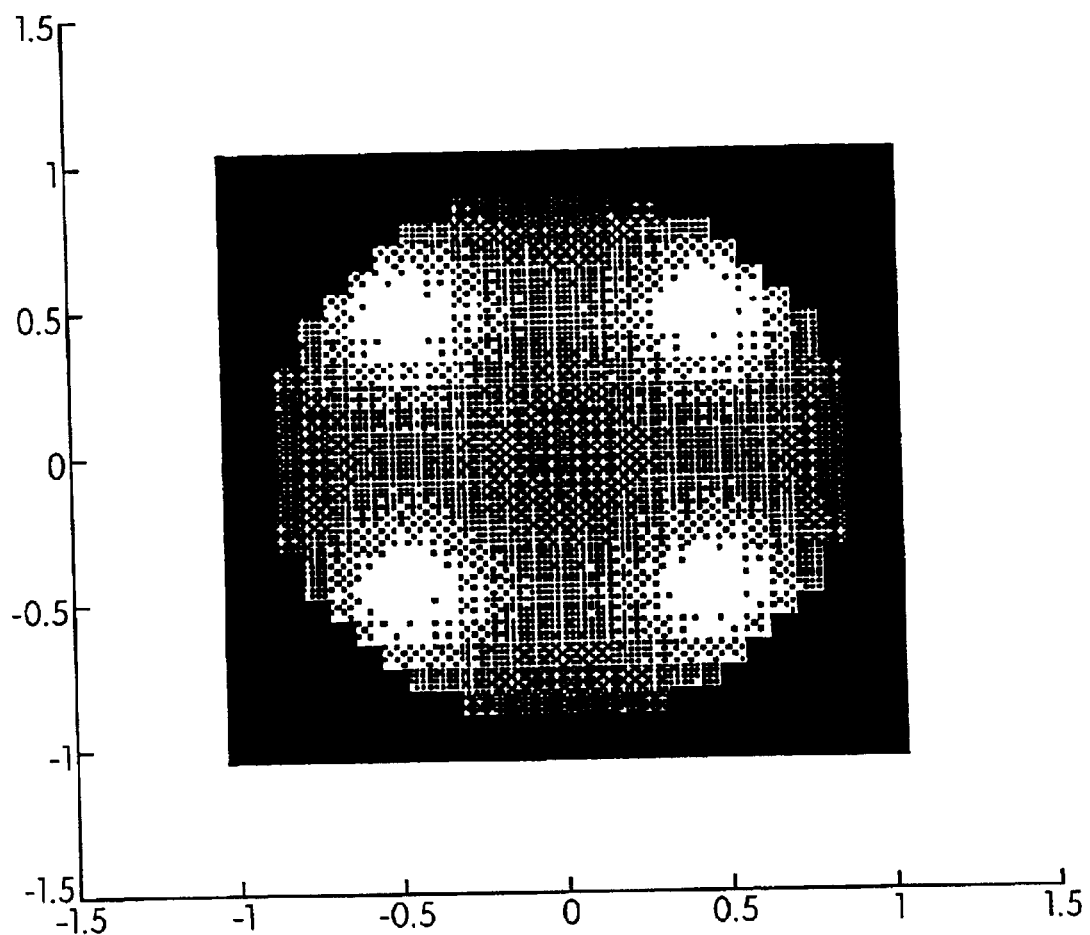
FIG. 4 is a plot of the x-y distribution of dithered bilevel masking cells for an illumination aperture consisting of four circular normal distributed-intensity zones placed at diagonal positions corresponding to off-axis illumination for geometry oriented in horizontal and vertical directions. The axes are divided into relative distances using the center and the edges of the mask.
Figure 5:
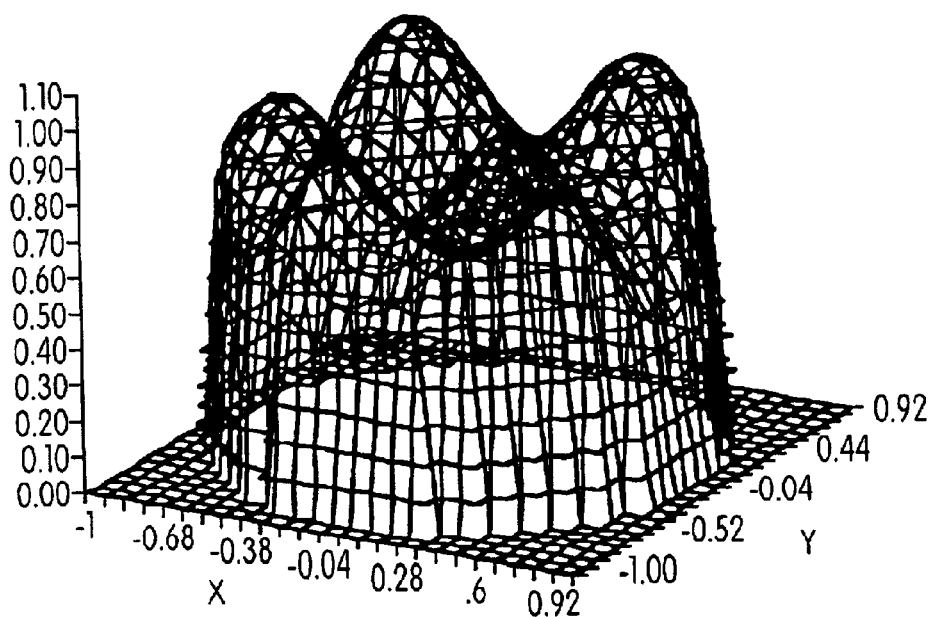
FIG. 5 is a three dimensional plot of the x-y distribution shown in FIG. 4.
Figure 6:
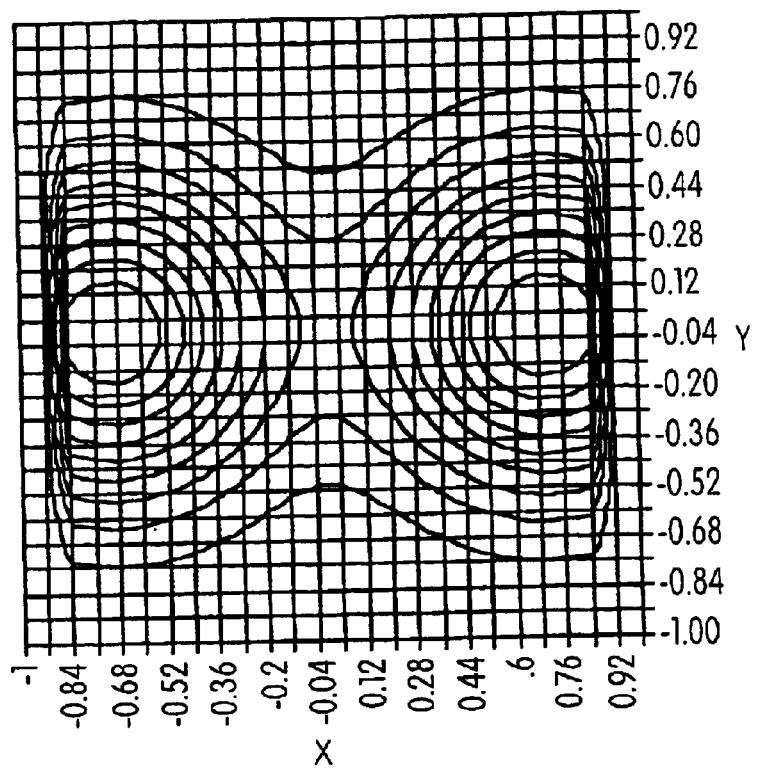
FIG. 6 is a drawing of surface contours of the continuous tone intensity distribution for a masking aperture based on two distributed-intensity zones where the maximum off-axis angle is limited to one direction.
Figure 19:
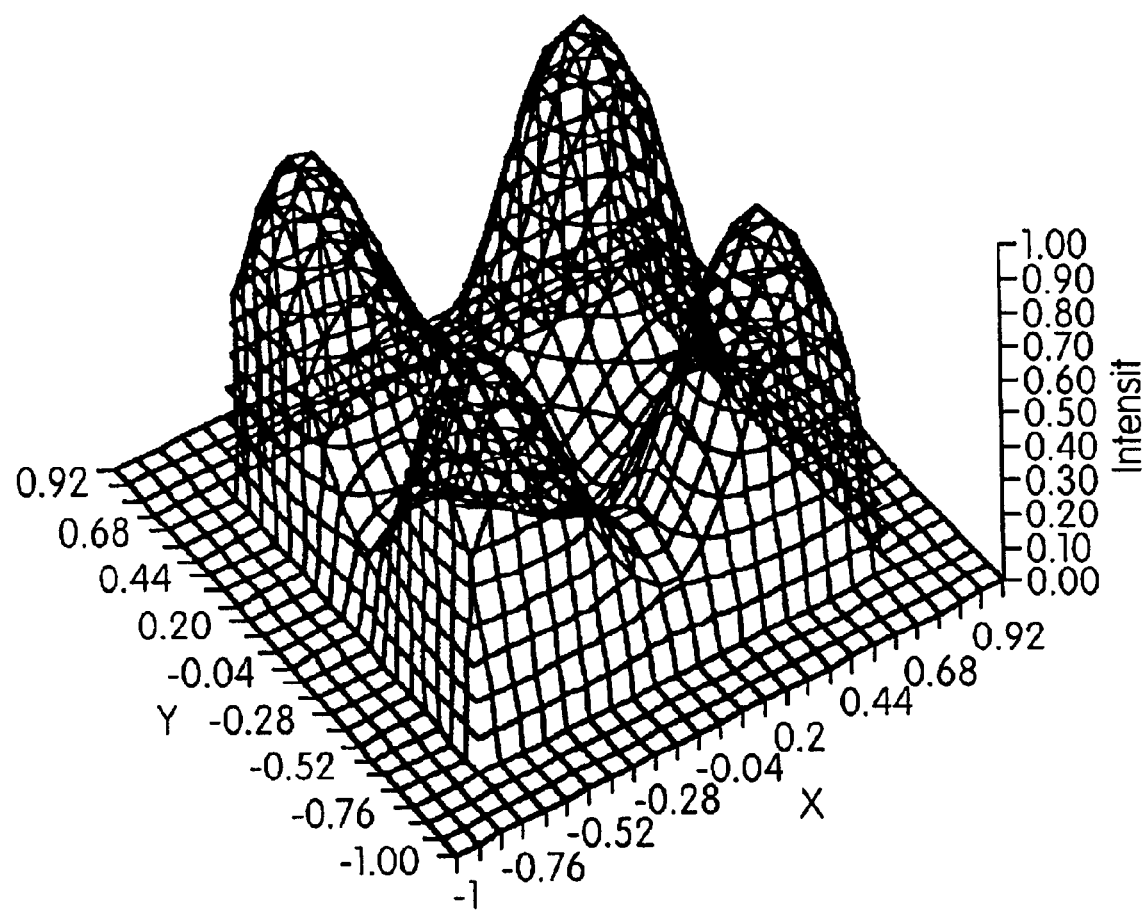
FIG. 19 is a three dimensional plot of circular gaussian zones and a square limiting zone used to limit the on-axis illumination component while retaining off-axis zone energy.

In the present invention, the existing intensity distribution at the pupil plane of an illumination system for a projection exposure tool is modified through use of a bilevel masking aperture containing a masking cell representation of a continuous tone intensity distribution. FIGS. 4 and 5 show such distributions where four distributed-intensity zones allow for off-axis and on-axis illumination of a photomask that contains geometry oriented in horizontal and vertical directions only. A maximum circular dimension is defined by a limiting zone, designed to limit the maximum off-axis angle projected onto the mask. This is used to balance the off-axis illumination provided to the mask with the degree of coherency of the on-axis illumination. Smaller geometry requires higher levels of on-axis partial coherence, leading to larger limiting zones. The extent of the zone will generally correspond to positions near or beyond the maximum zone or angular position for the off-axis illumination, generally in, but not limited to, the range from 0.5 to 1.0. The intensity at any position located beyond this limiting zone is set to zero. The shape of this limiting zone is not necessarily circular, and selection of the shape will depend on the extent of feature orientation at the mask. Features constrained to one orientation only require limitation of off-axis illumination in one direction, resulting in assigning a value of zero to any element beyond the required x or y value corresponding to the limiting angle, as shown in FIG. 6. This allows for maximum energy at angles with the desired range and can lead to improved imaging and throughput performance. Features constrained to two orientations only require that the aperture limit off-axis illumination angles in two orthogonal directions, leading to a non-circular or square two dimensional character of the limiting zone as shown in FIG. 19. The invention allows for this tailoring of the illumination.

If the existing illumination intensity distribution at the pupil plane of the illumination system is not uniform, the non-uniformity at the plane can be deconvolved in accordance with the invention to result in a masking aperture that also incorporates compensation for non-uniformity. For example, many steppers provide a pupil that is guaranteed uniform (+/-1%) for only 80% of its full opening. At 85% open, the uniformity of illumination may vary up to +/-10% or more. With the invention, the non-uniformity may be canceled or reduced to an acceptable level.

The overlapping of the continuous intensity regions in the center of the illumination field produces the on-axis character required for less dense features. The central intensity is generally greater than 0% and is commonly in the 10 to 50% range.

Illumination zones within the masking aperture control the illumination to mask and are designed to produce optimal off-axis, on-axis, or combined illumination. This invention allows for an infinite variety and number of such zones. Some are most desirable.

Figure 7:
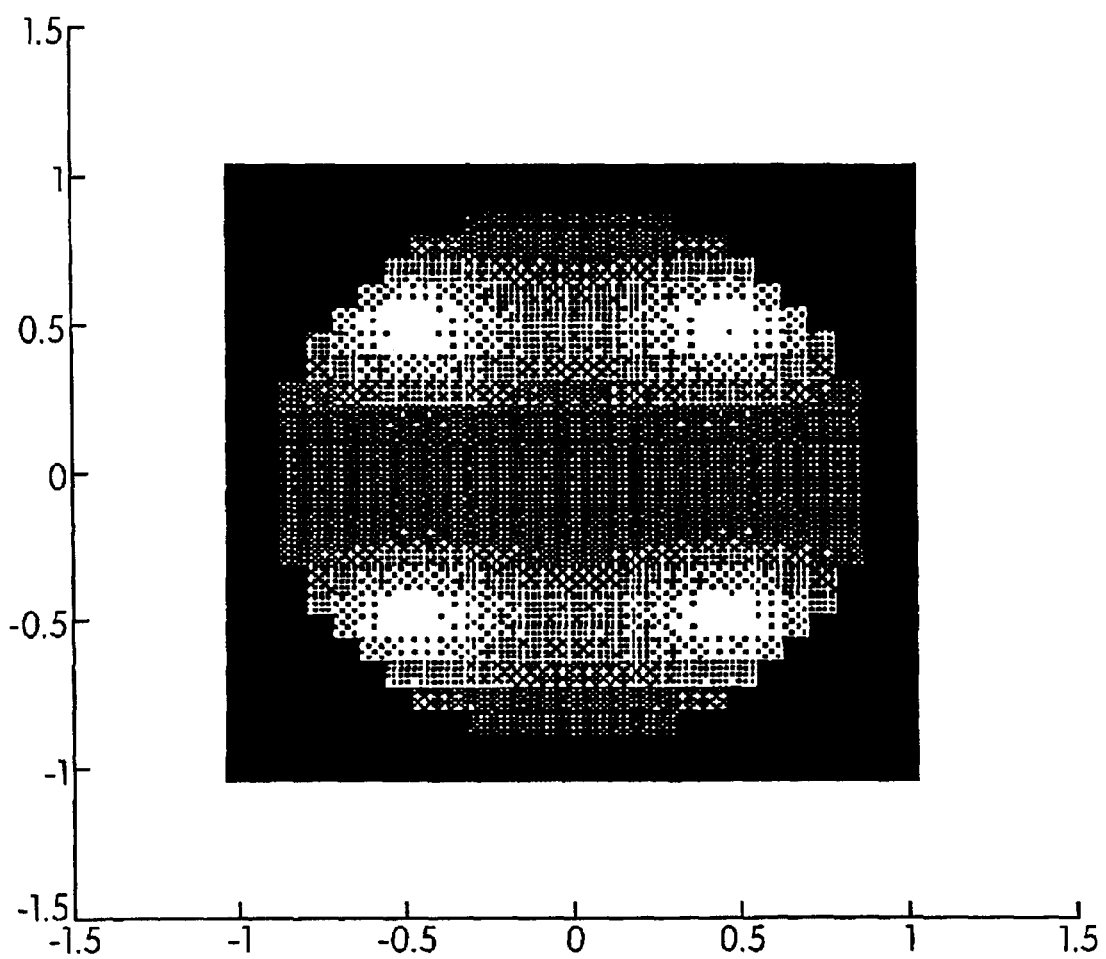
FIG. 7 is a plot of the x-y distribution of dithered, bilevel masking cells for an illumination aperture consisting of four elliptical normal distributed-intensity zones placed at diagonal positions corresponding to off-axis illumination for geometry oriented in horizontal and vertical directions. The axes are divided into relative distances using the center and the edges of the mask.
Figure 8:
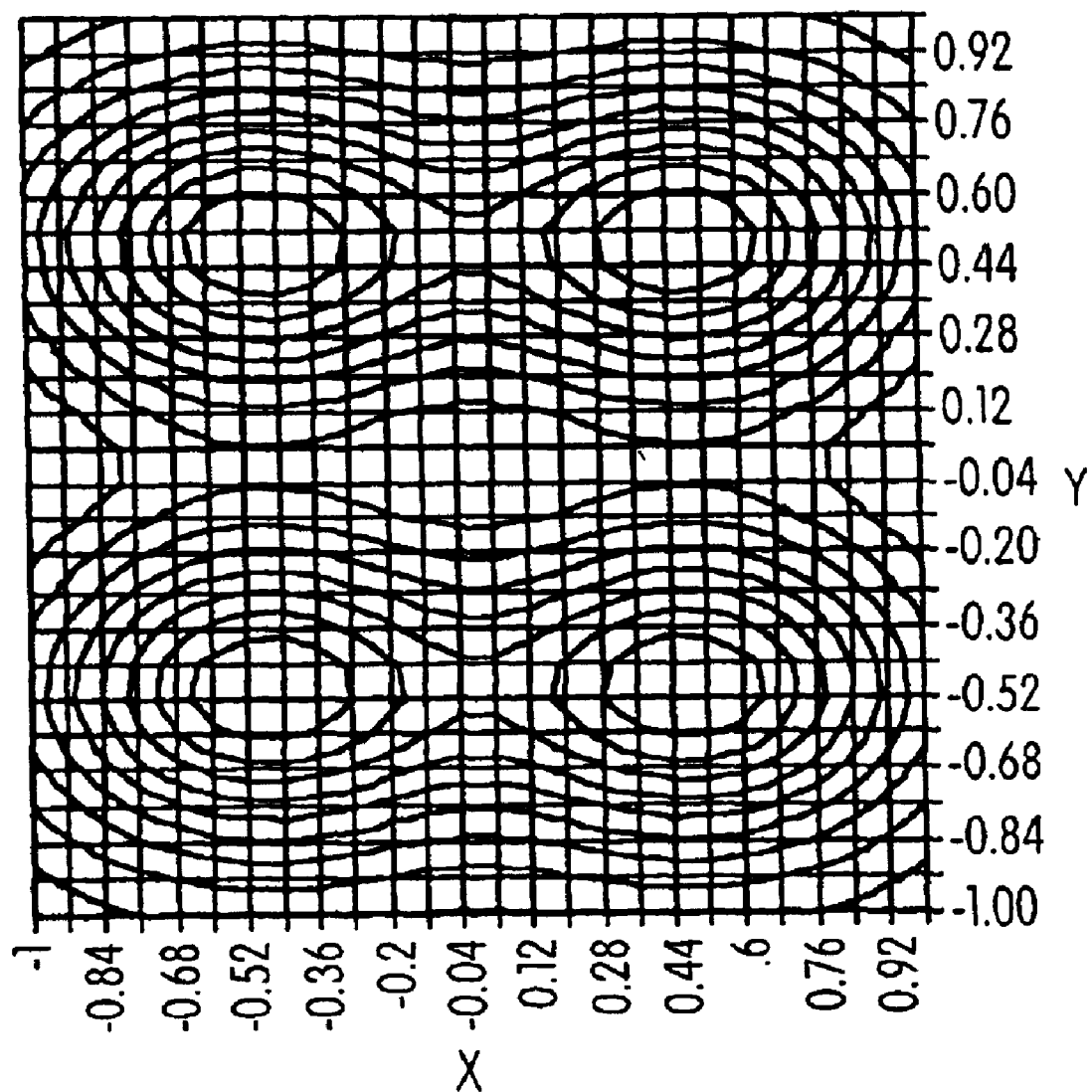
FIG. 8 is a contour plot of the x-y distribution shown in FIG. 7.
Figure 18:
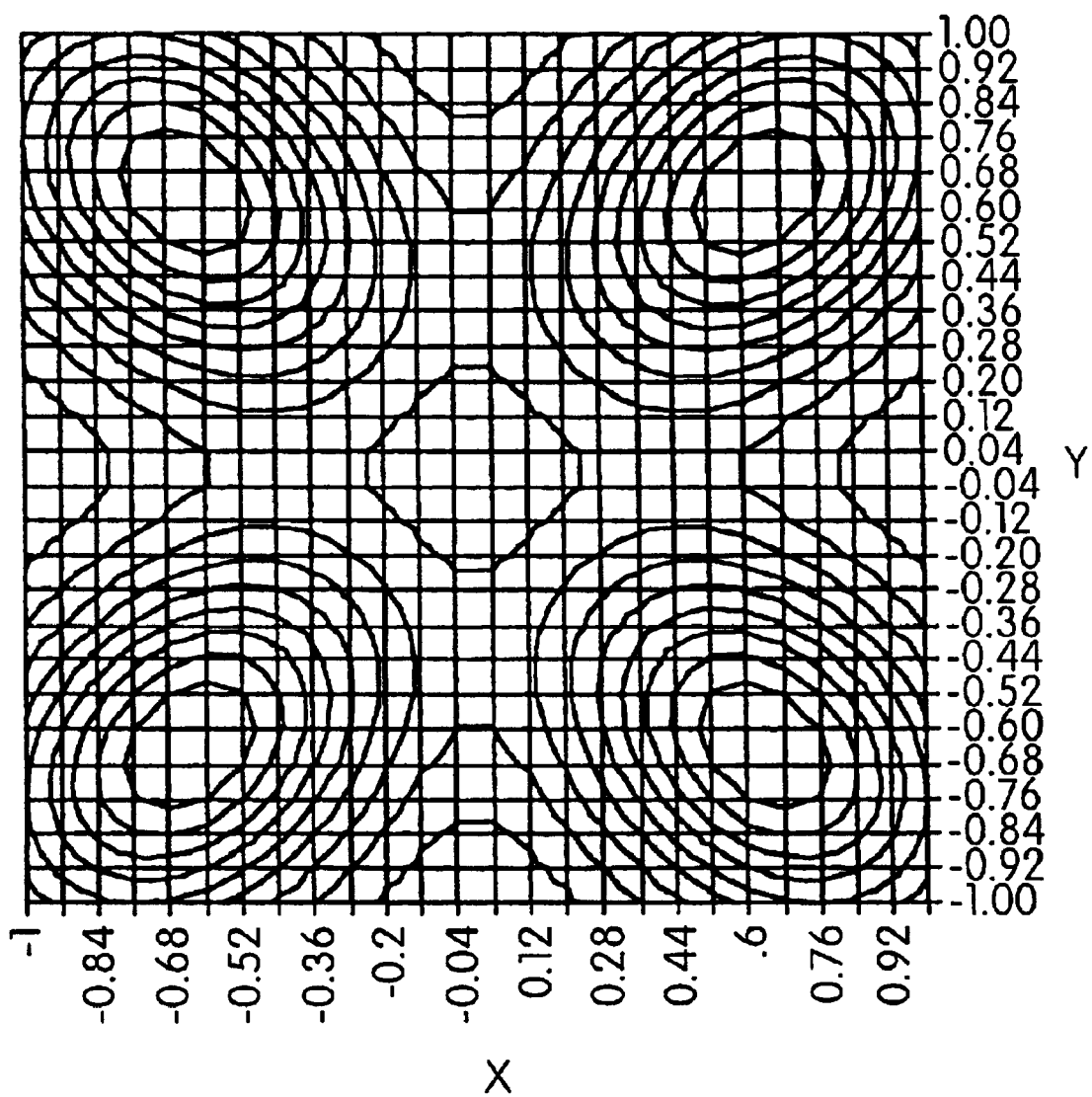
FIG. 18 is a contour plot of circular gaussian zones used to optimize energy distribution in the pupil, where energy is concentrated in the center of the pupil and at off-axis angles.

Zones may be circular, elliptical, 45 degree elliptical (that is, elliptical but oriented with axes at angles of 45 degrees and 135 degrees), square, or other shapes dependent on the desired distribution of diffraction information to match mask geometry requirements or specific lens behavior. The distribution of the energy in these zones or rings may be stepped, Gaussian, Lorentzian, or other similar shape. The kurtosis of gaussian distributions may be normal (mesokurtic), narrow (leptokurtic), or flat-topped (platykurtic), or combinations of these among zones. Skewness, or departure from symmetry of the distribution may be utilized for differential weighting of certain feature sizes. Circular symmetry may be best suited for most general cases and elliptical distributions can be utilized to accommodate x-y nonuniformities of the photomask or imparted by the projection lens (a result for instance of astigmatic or comatic aberration). FIGS. 7 and 8 show four elliptical normal distributed-intensity zones placed at diagonal positions corresponding to off-axis illumination for geometry oriented in horizontal and vertical directions. FIG. 18 shows how rotated elliptical gaussian zones can offer improvements in intensity distribution for x and y oriented geometry by concentrating some energy in the center of the pupil and the remaining energy distributed at four-zone angles. Here, rotation of the zone axis allows for a symmetrical distribution. In this case, energy on the x/y axes is limited, reducing the non-optimal, on-axis illumination of targeted dense features. An increase in the efficiency of zero and first diffraction order overlap can result from such an illumination distribution.

Figure 9:
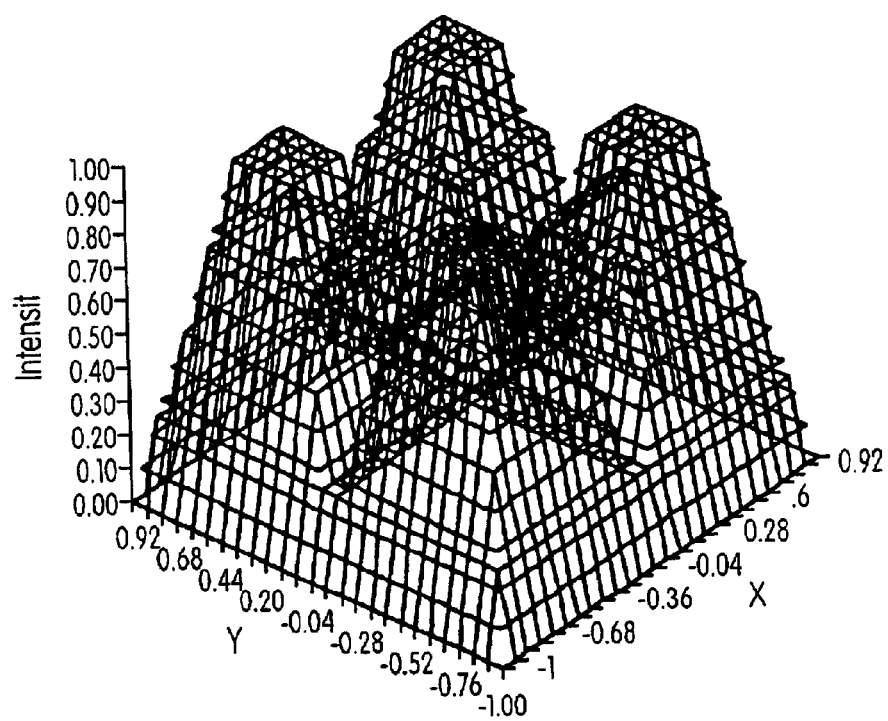
FIG. 9 is a three dimensional plot of the x-y distribution for an illumination aperture consisting of four stepped square distributed-intensity zones placed at diagonal positions corresponding to off-axis illumination for geometry oriented in horizontal and vertical directions.
Figure 10:
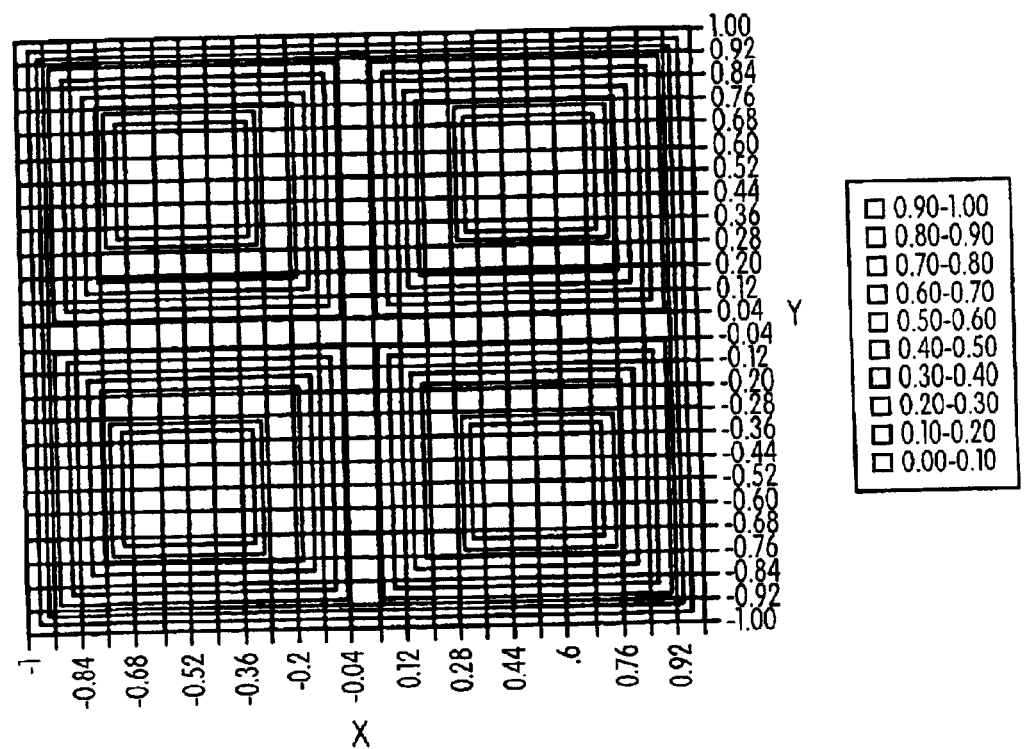
FIG. 10 is a contour plot of the x-y distribution for an illumination aperture consisting of four stepped square distributed-intensity zones, as described for FIG. 9.
Figure 11:
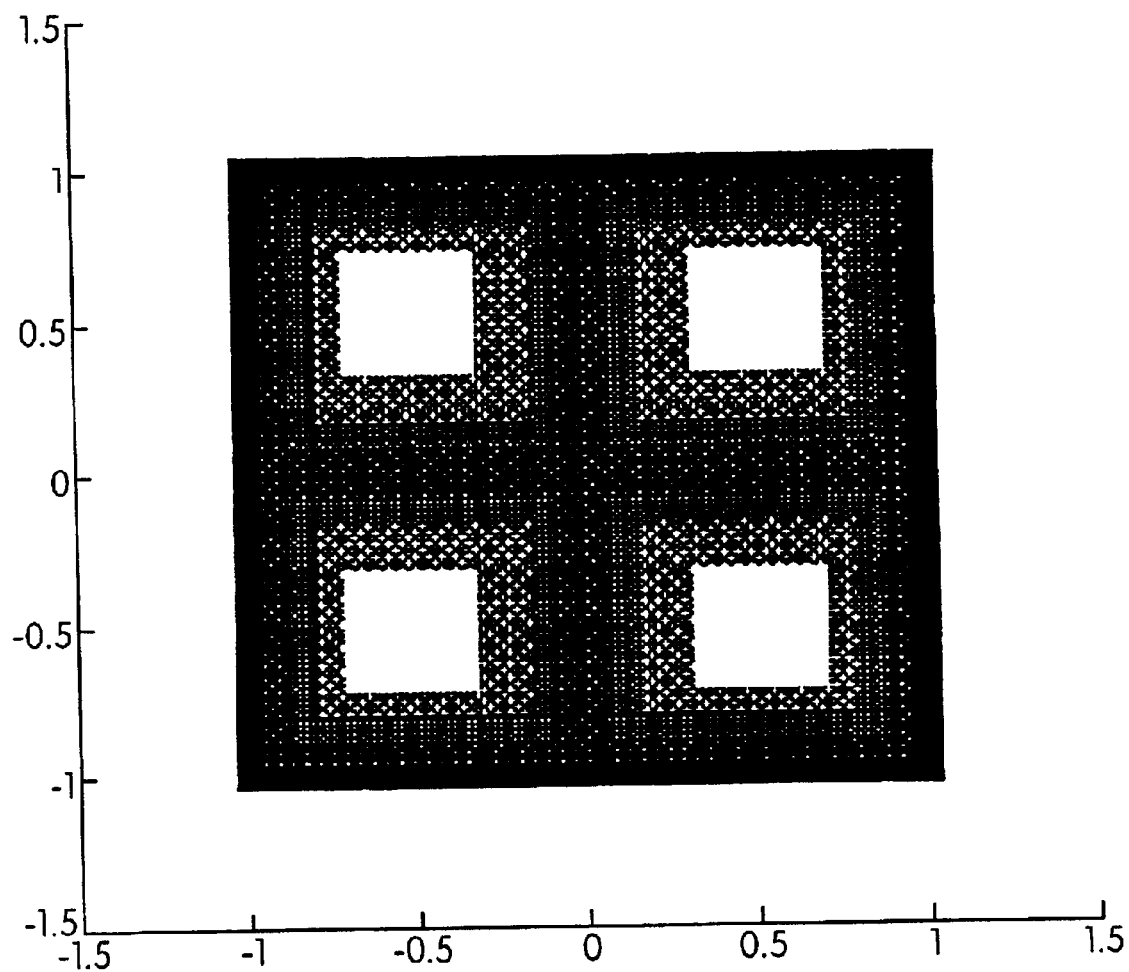
FIG. 11 is a plot of the x-y distribution of dithered, bilevel masking cells for an illumination aperture consisting of four elliptical normal distributed-intensity zones, as described for FIG. 9.

For imaging of geometry in two directions only (x and y only for instance), there is only a need to spread diffraction order information in the direction of geometry. By limiting zone intensity distribution to x and y directions, resulting in continuous intensity or stepped-square shaped zones, maximum off-axis illumination is maintained up to the maximum angle allowed by the zone dimensions. Beyond these angles, the degree of off-axis illumination is limited and can be tailored more specifically for the x and y oriented geometry. FIGS. 9 and 10 shows how stepped-square zones are implemented in an illumination profile. FIG. 11 shows how this is translated into the bi-level representation.

Figure 21:
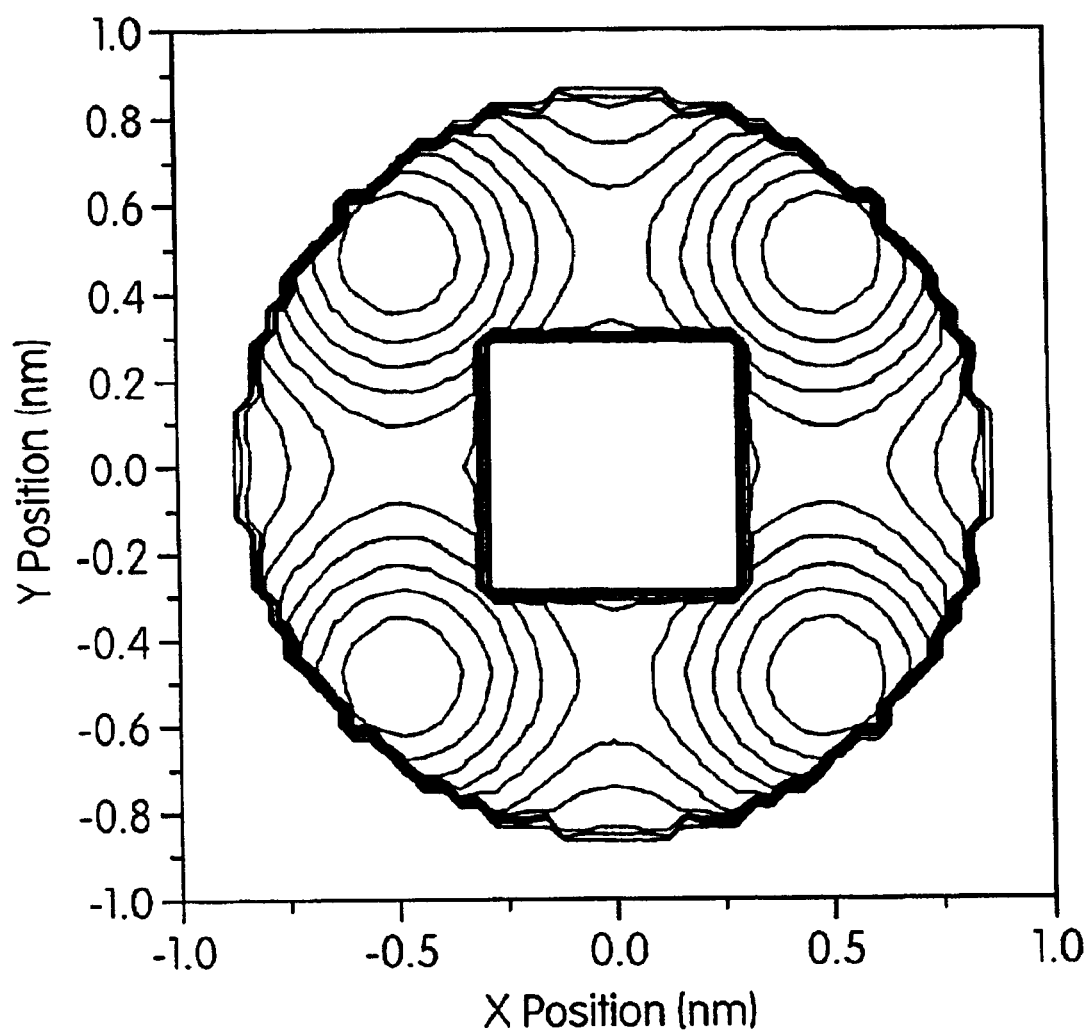
FIG. 21 shows how a square central obscuration can be included in an aperture to reduce the on-axis character of illumination and improve the performance of dense features.
Figure 22:
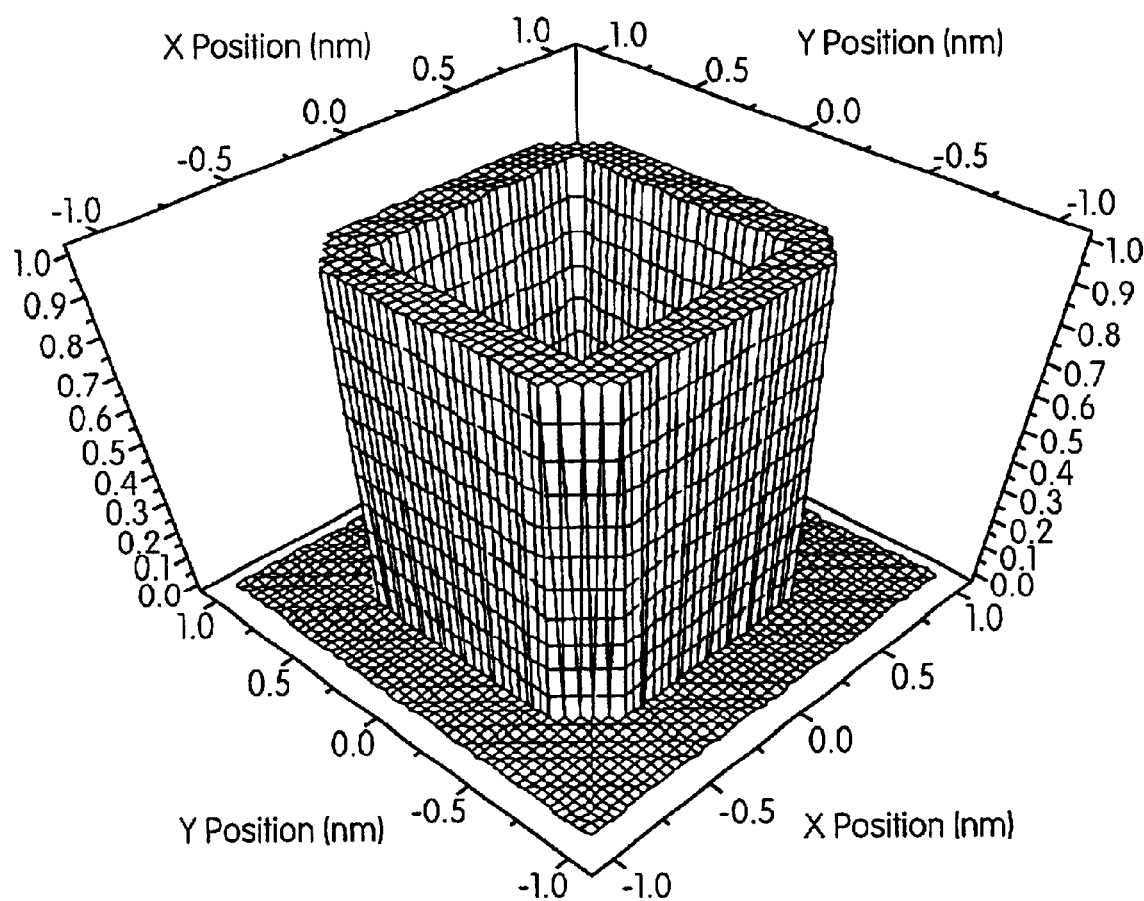
FIG. 22 shows the square ring, off-axis source which delivers optimal off-axis illumination for dense features while providing on-axis illumination for more isolated features.
Figure 23:
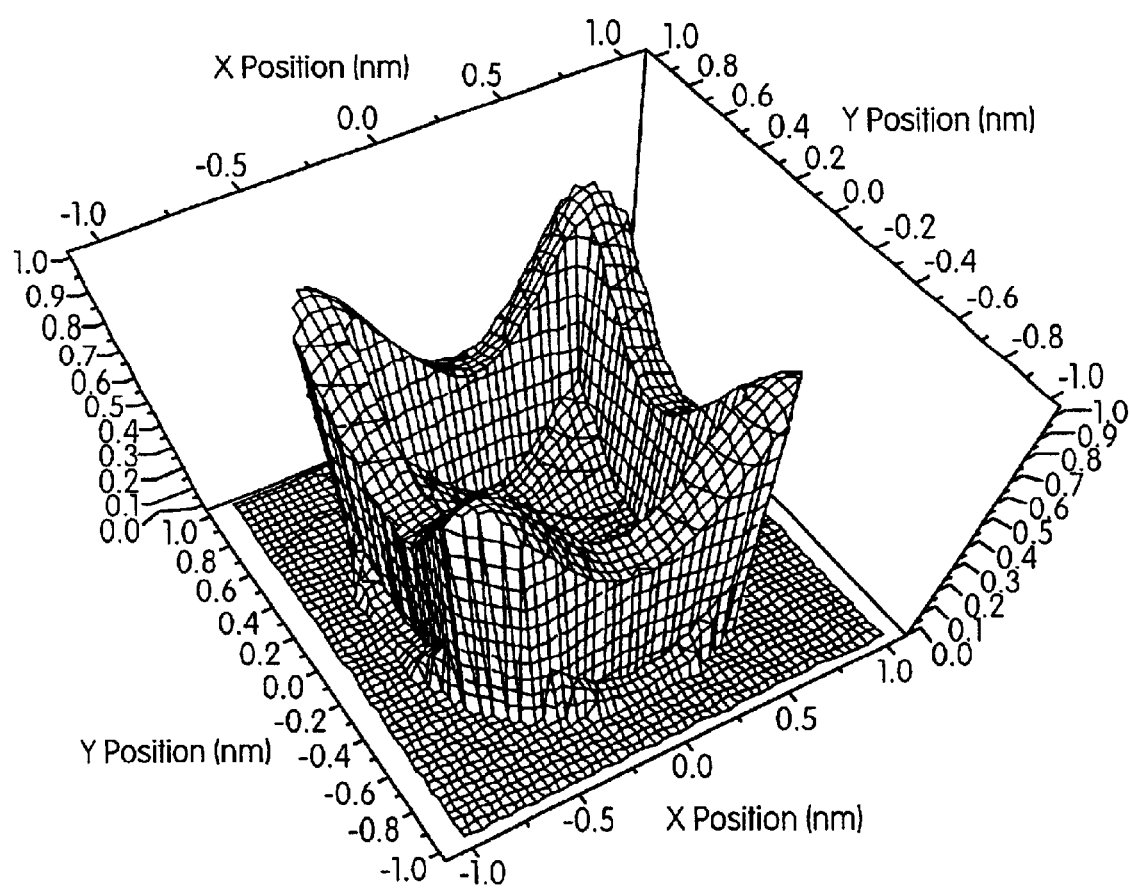
FIG. 23 shows how the square ring approach can be combined with the gaussian four-zone approach to emphasize corner zone effects.

A square or rectangular shaped obscuration (or an inner limiting zone) emphasizes the off-axis illumination for feature pitch values whose frequency distribution falls beyond the chosen value (greater than lambda/(w*NA) where w is the full width obscuration value between 0 and 2). This is shown in FIG. 21 for a Gaussian of axis distribution where the obscuration is 30% of the full aperture width. Combining a square outer limiting zone and a square obscuration, an optimal condition of off axis illumination exists also. For features oriented in one direction only, only two zones are needed on an axis opposite to the feature direction. These zones can be slots or rectangles since spreading of energy in the direction of feature orientation is of no consequence to imaging performance and increases throughput. With two dimensional geometry, four slots are needed in x and y direction, resulting in a square ring, as shown in FIG. 22. This ring can also be considered as the combination of a square limiting zone and square obscuration. This rectangular ring source distribution can deliver off-axis illumination for features to 0.25 lambda/NA, depending on the choice of the limiting outer square lone. This square ring source distribution can also be combined with other off axis approaches, such as a Gaussian four-zone design. FIG. 23 shows how a square ring source distribution is added to a Gaussian four-zone design to produce results that are common to both approaches (that is better performance for more dense features out to 0.25 lambda/NA and adequate through focus and through pitch imaging performance).

Figure 24:
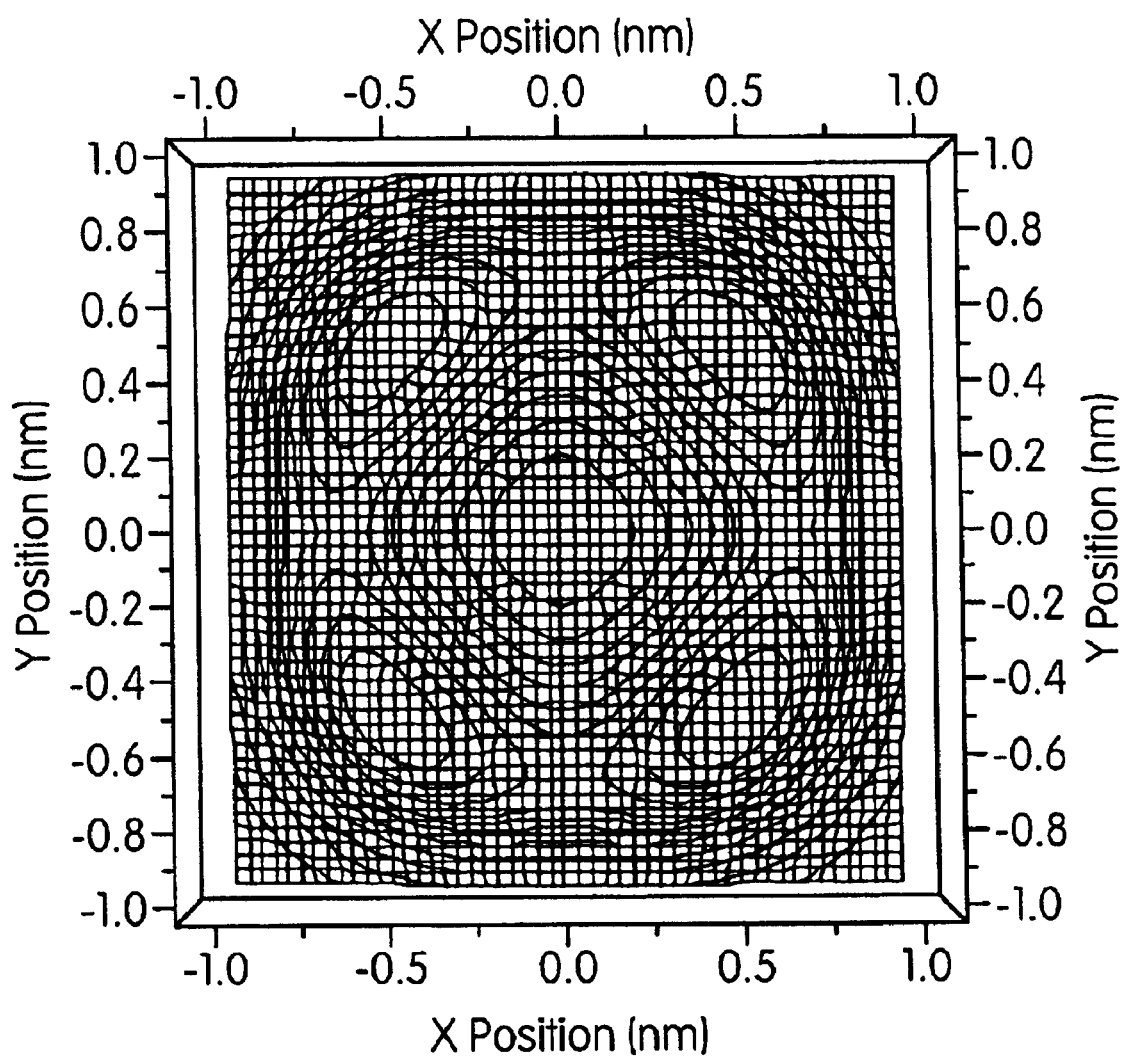
FIG. 24 is a contour plot of a combined annular and gaussian four-zone aperture to improve the off-axis character of annular illumination.

Other combinations of source distributions are possible. FIG. 24 shows how an annulur ring is combined with a gaussian four-zone design to emphasize the performance of more dense features than possible with the annular distribution alone. This approach can increase the off-axis character of the annulus and reduce the non-optimal on-axis character.

Figure 12:
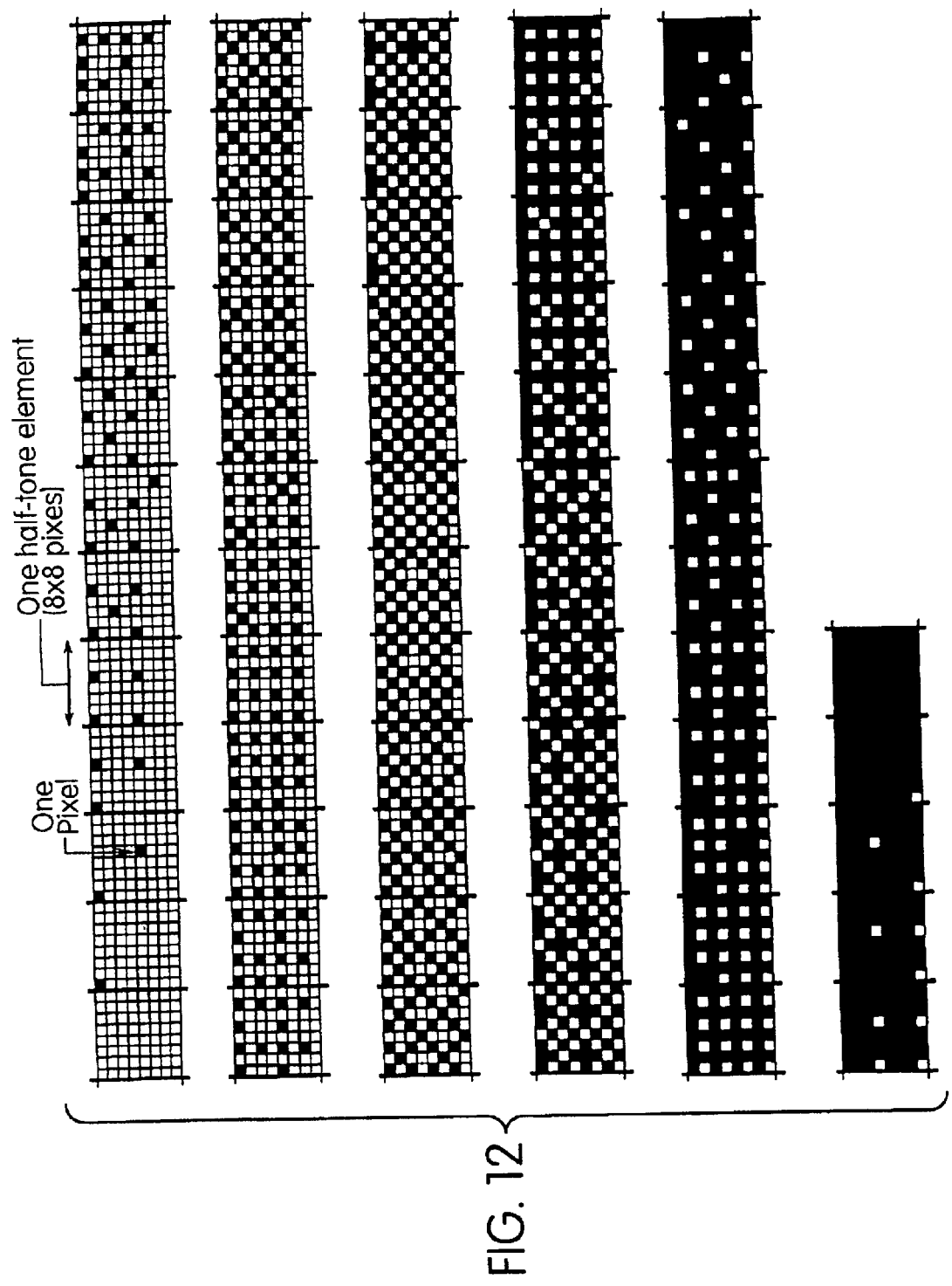
FIG. 12 is a schematic representation of the bilevel representation of 65 gray levels using the ordered dithering algorithm.

The masking aperture varies the intensity of the transmitted light at any element by modulating the state of pixels in each element. The highest intensity element has all pixels on or at maximum intensity. Light of suitable wavelength passes through without attenuation. In a preferred embodiment as shown in FIG. 12, an element with 64 pixels at a minimum intensity attenuates or blocks all light. Pixels of intensity between none and all are created by the number of pixels in a given element.

A masking aperture with a bilevel representation of such an illumination distribution is created by dithering the continuous tone images. Random techniques or fixed threshold techniques can be used. These fixed threshold techniques are based on decision rules where any intensity value greater than a threshold value (T) results in a transparent masking cell and a value less than T results in an opaque masking cell. The result is generally a high degree on banding in the bilevel representation. A slight improvement over this method is to replace T with equally distributed random numbers over the range 0 to S with a new random number generated for each intensity value. Less banding results but signal to noise is low. A superior approach to the dithered representation is possible by comparing image intensity values to position dependent thresholds contained in an n×n dither matrix, $D^n$. For a $D^n$ matrix, a matrix element $D^n_{i,j}$ is chosen based on a rule set that causes the dither matrix to be repeated in a checkerboard fashion over the entire image with minimum low spatial frequency noise. The proper choice of the dither matrix results in minimum texture or artifacts and maximum uniformity in intensity. In general, the optimum dither matrix is represented by the recursion relationship:

$$D^n = \begin{vmatrix} 4D^{n/2} + D^2_{00} U^{n/2} 4D^{n/2} + D^2_{01} U^{n/2} \\ 4D^{n/2} + D^2_{10} U^{n/2} 4D^{n/2} + D^2_{11} U^{n/2} \end{vmatrix}$$

where:

$$U^n = \begin{vmatrix} 1 & 1 & \ldots & 1 \\ 1 & & & \\ \vdots & & & \\ 1 & & & \end{vmatrix}.$$

To produce an 8×8 matrix to satisfy these optimization criteria, D8 becomes:

$$D^8 = \begin{vmatrix} 0 & 32 & 8 & 40 & 2 & 34 & 10 & 42 \\ 48 & 16 & 56 & 24 & 50 & 18 & 58 & 26 \\ 12 & 44 & 4 & 36 & 14 & 46 & 6 & 38 \\ 60 & 28 & 52 & 20 & 62 & 30 & 54 & 22 \\ 3 & 35 & 11 & 43 & 1 & 33 & 9 & 41 \\ 51 & 19 & 59 & 27 & 49 & 17 & 57 & 25 \\ 15 & 47 & 7 & 39 & 13 & 45 & 5 & 37 \\ 63 & 31 & 55 & 23 & 61 & 29 & 53 & 21 \end{vmatrix}.$$

Figure 26:
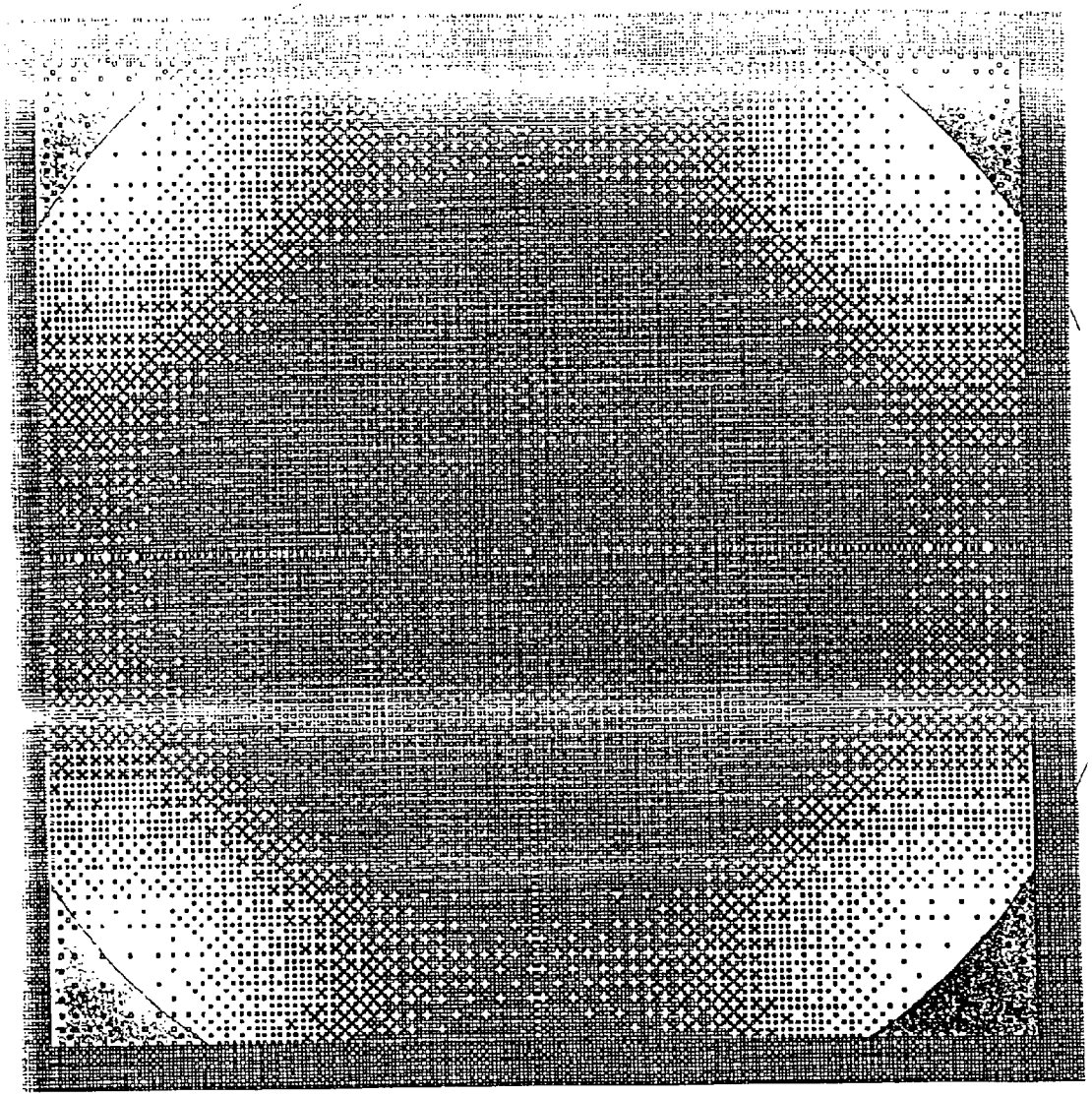
FIG. 26 is a 51×51 element array of a dithered half tone pattern.

To utilize this dithering matrix, for example, a continuous tone element intensity distribution is divided into 64 levels. The lowest intensity level places a pixel in the masking element at the zero position. An intensity value of 50% places pixels in the first 31 positions, and so forth. FIG. 12 schematically depicts the bilevel representation of 65 gray levels using the ordered dithering algorithm. FIG. 26 shows how this approach is used in a 51×51 element array. Other possibilities, such as 2-level, 4-level, 16-level, and so forth, are solved for in a similar manner.

Figure 13:
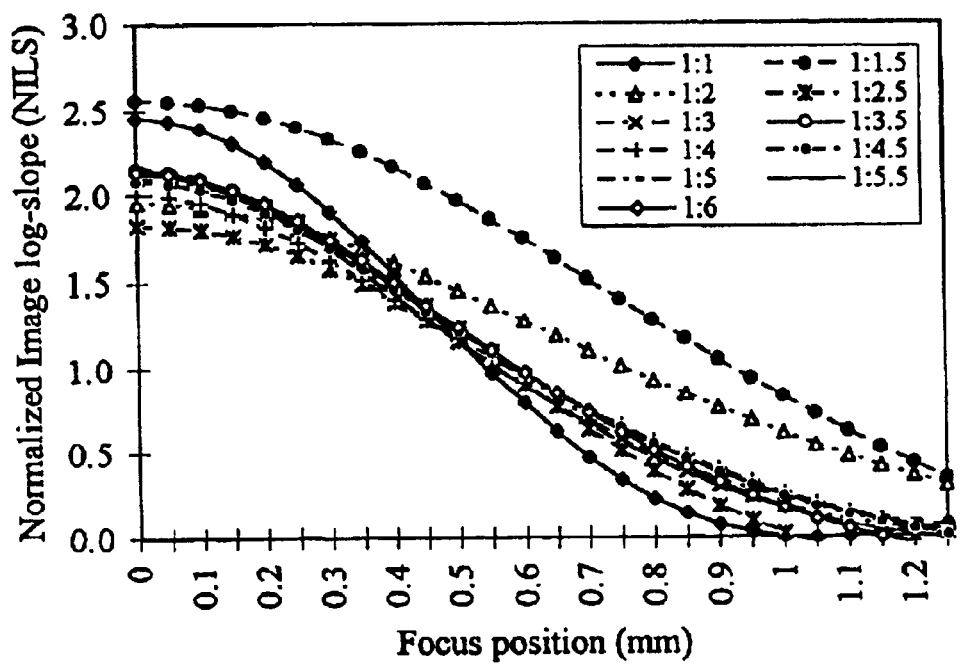
FIG. 13 is a graph showing normalized aerial image log-slope (NILS) vs focus for 130 nm features using four-zone illumination, $\sigma_c=0.68$ and $\sigma_r=0.20$.
Figure 14:
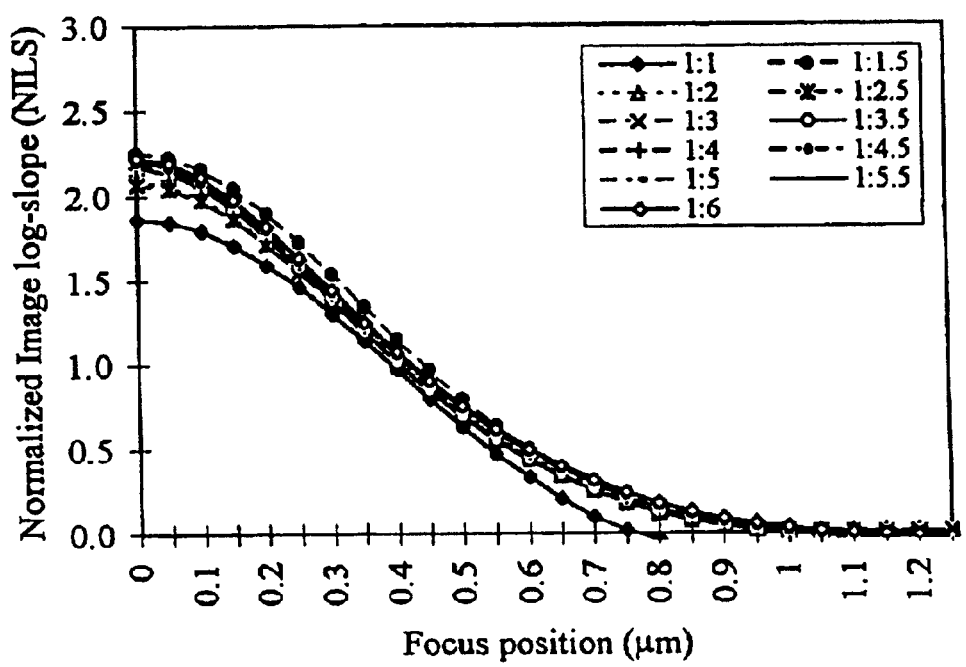
FIG. 14 is a graph showing normalized aerial image log-slope (NILS) vs. focus for 130 nm features using distributed-intensity four-zone illumination ($\sigma_c=0.68$ and $\sigma_r 0.30$) and a circular hard stop ($\sigma=0.8$).
Figure 15A:
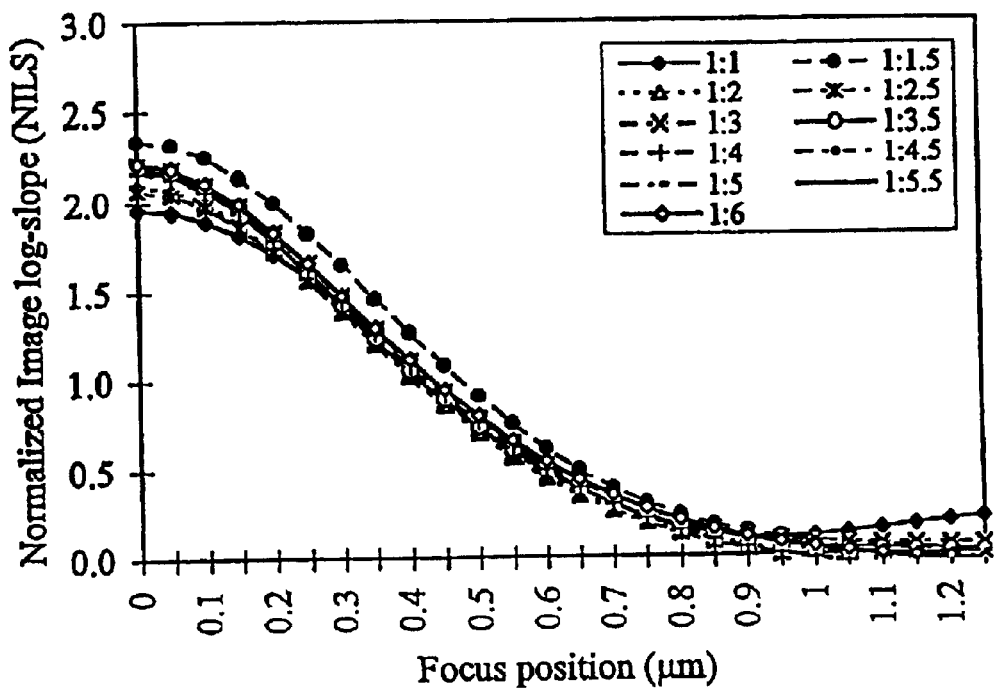
FIG. 15a is a graph showing normalized image log slope (NILS) vs. focus for 130 nm features using the illumination shown in FIG. 19.
Figure 15B:
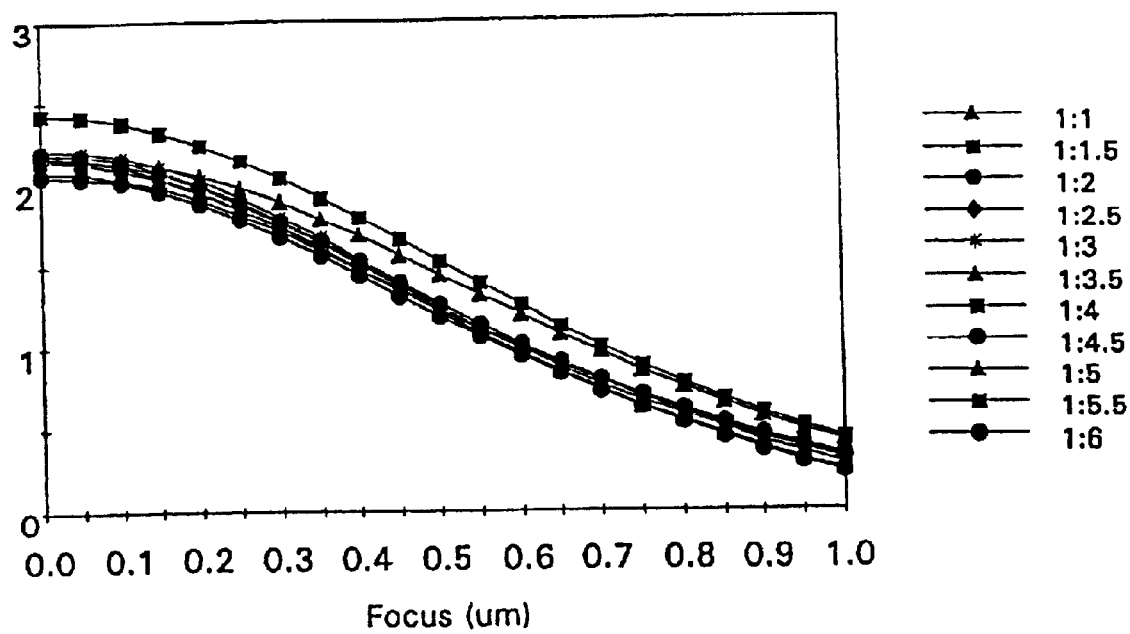
FIG. 15b is a graph showing normalized image log slope (NILS) vs. focus for 130 nm features using the illumination shown in FIG. 23.
Figure 15C:
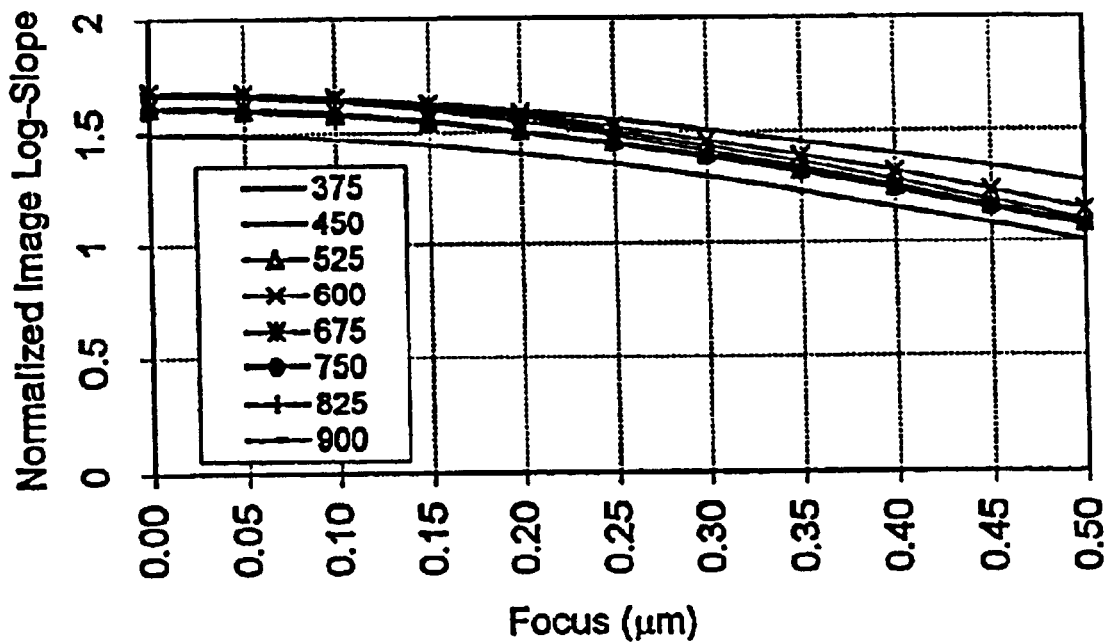
FIG. 15c is a graph showing normalized image log slope (NILS) vs. focus for annular ring illumination of 150 nm features using 248 nm wavelength and 0.63 NA, with duty ration of 1:1.5 to 1:5.
Figure 15D:
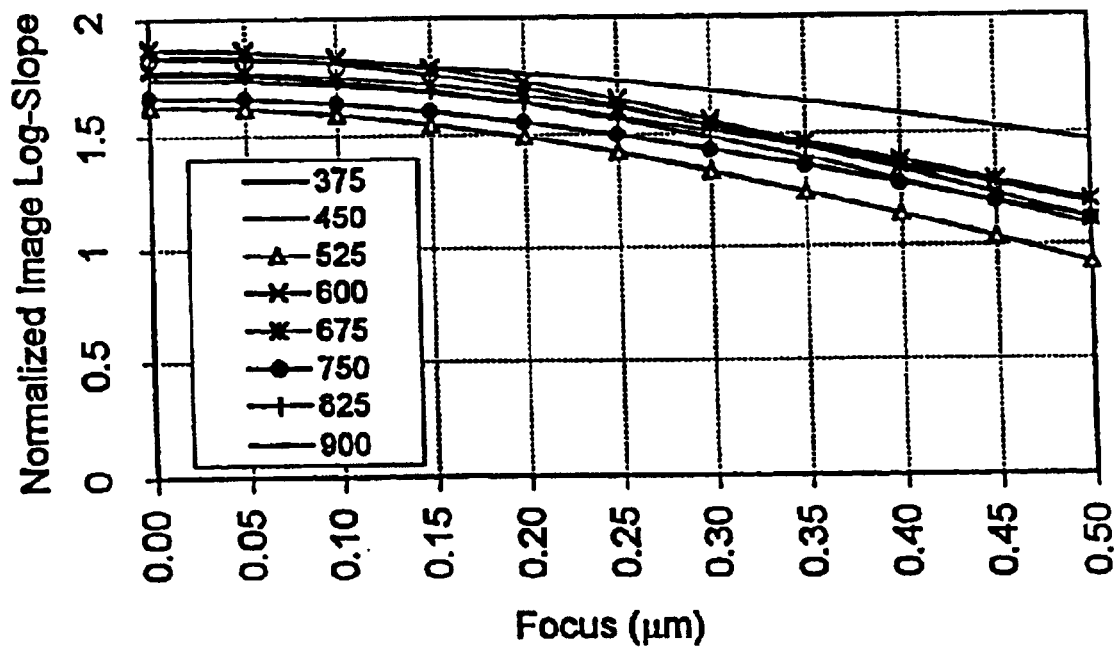
FIG. 15d is a graph showing normalized image log slope (NILS) vs. focus for square ring illumination of 150 nm features using 248 nm wavelength and 0.63 NA, with duty ration of 1:1.5 to 1:5.

The performance improvement for 130 nm features using a 193 nm wavelength and 0.60 lens numerical aperture is described using a normalized aerial image log-slope NILS metric (normalized to the feature size). This is the log of the slope of the intensity image (or aerial image). FIGS. 13 and 14 show NILS plotted against focus position for circular zone and a bi-level representation of distributed-intensity zone off-axis illumination where the central intensity is 26%. The ratios are the line to space size ratio, or duty ratio. The falloff of NILS across all feature duty ratios matches more closely with increasing amounts of defocus for the distributed-intensity zone illumination compared to the circular zone condition. The resulting impact on lithographic imaging is a reduction in the dense to isolated line proximity effect. FIG. 15a shows the imaging improvement achieved with the square limiting zone using the illumination profile of FIG. 19. FIG. 15b shows the further improvement using the hybrid design of FIG. 23. FIGS. 15a/d show a comparison of the square ring of FIG. 22 with an annular (circular) ring for a 248 nm wavelength, 0.63 NA & 150 nm features at 1:1.5 duty ratio to 1:5 duty ratio. FIG. 15c shows the performance for an annular or circular ring and FIG. 15d shows the performance for the square ring. Illuminator dimensions are identical, only the shape differs. No circular or annular ring can match the performance of the square ring.

The amount of total intensity allowed to pass through a masking aperture will determine its acceptability in situations where exposure throughput is a concern, such as with the fabrication of integrated circuit devices. Table 2 is a comparison of the throughput efficiency of several variations of the distributed-intensity four-zone approach, measured relative to conventional illumination with a σ of 0.7 and a strong circular zone approach, where off-axis illumination is provided by four circular zones on a zero transmission field. The worst case throughput is for the circular zone four-zone design, where the total intensity through the pupil is 27% of that for conventional illumination with σ=0.7. The distributed-intensity four-zone approach with a 0.7σ circular hard stop leads to 83% throughput and the same design with a 0.7 half-width square hard stop results in 85% throughput. If the square limiting zone is increased in size to 0.8 half-width, the throughput increases to 93% and imaging performance remains comparable to the circular hard stop. This efficiency comes about because of the amount of energy allowed at the corners of the square pupil, where the diagonal approaches the full extent of the condenser lens pupil, or a σ value near 1.0. Comparison of intensity throughput is an important one as illumination modification is considered. If the illumination system of an exposure tool can allow full value, σ=1 operation, this square hard stop variation of the distributed-intensity four-zone can lead to minimal losses.

TABLE 2

| Illumination approach | Relative Intensity |
|---|---|
| Conventional, 0.7σ | 1.00 |
| Circular four-zone 0.68σc, 0.2σr, 0.8σ stop, 0% field | 0.27 |
| Circular four-zone, 0.68σc, 0.2σr, 0.8σ stop, 25% field | 0.52 |
| Distributed-intensity four-zone, 0.68σc, 0.3σr, 0.7σ circular stop | 0.83 |
| Distributed-intensity four-zone, 0.68σc, 0.3σr, 0.7σ square stop | 0.85 |
| Distributed-intensity four-zone, 0.68σc, 0.3σr, 0.8σ square stop | 0.93 |

Figure 16:
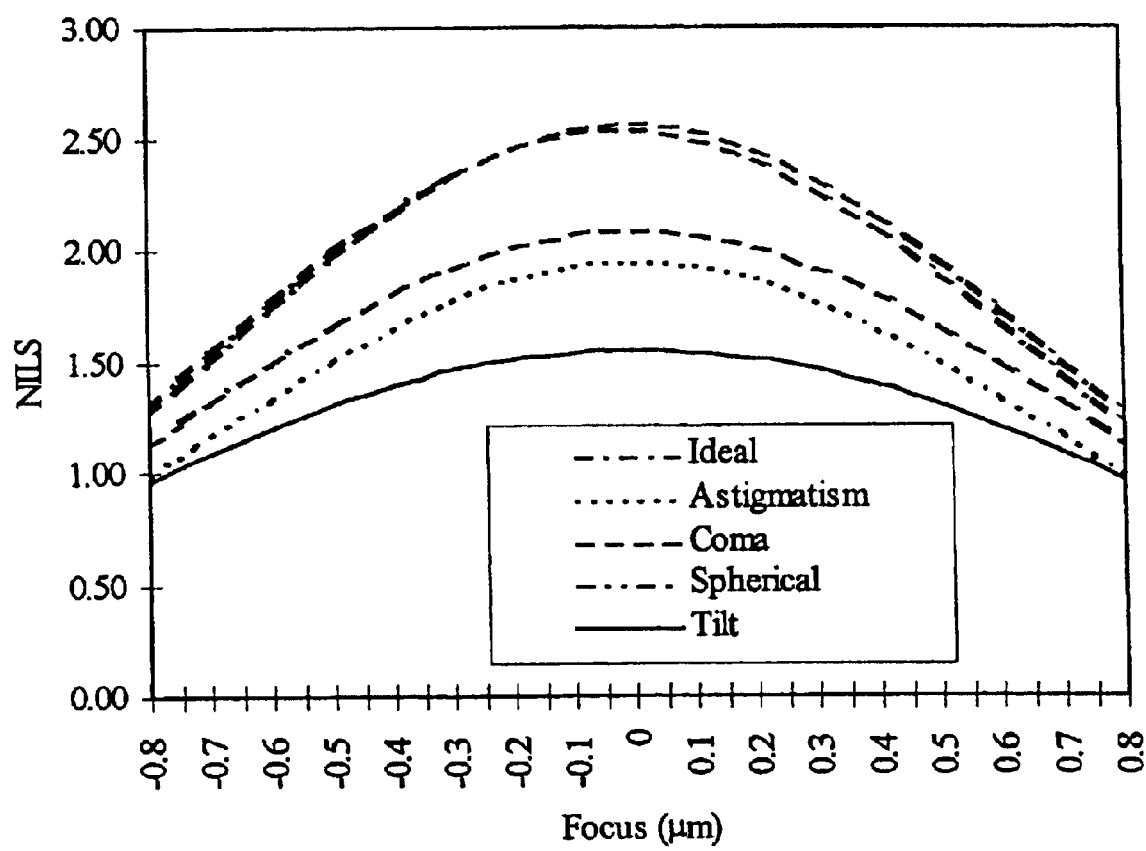
FIG. 16 is a plot of the normalized image log slope, showing influence of a circular four-zone ($\sigma_r=0.7$ and $\sigma r=0.2$ on a zero intensity field) with 0.1 waves of primary aberrations: astigmatism, tilt, spherical, and coma, through focus for a 130 nm features imaged with a 193 nm imaging system using a numerical aperture of 0.6.
Figure 17:
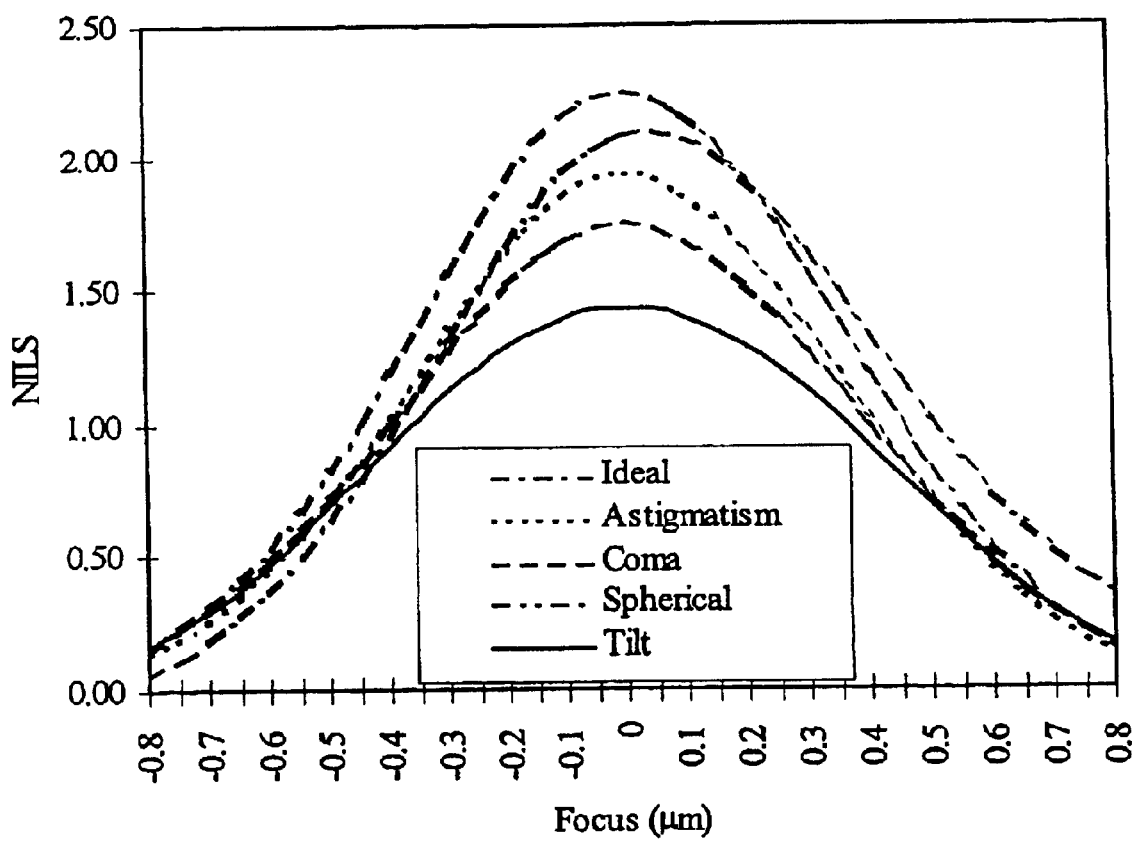
FIG. 17 is a plot of the normalized image log slope, using the bi-level representation of the distributed-intensity illumination described for this invention.

For on-axis conventional illumination, lens aberrations are evaluated assuming full use of a lens pupil. With off-axis illumination, diffraction information is distributed selectively over the lens pupil, influencing the impact of aberrations on imaging. In general, astigmatic effects can worsen while spherical aberration and defocus effects can be improved. Coma induced image placement can be further aggravated with OAI unless rebalanced with tilt. FIG. 14 shows how the normalized image log slope is impacted for circular four-zone ($\sigma_c$=0.7 and $c\sigma_r$=0.2 on a zero intensity field) with 0.1 waves of primary aberrations: astigmatism, tilt, spherical, and coma, through focus for a 130 nm features imaged with a 193 nm imaging system, using a numerical aperture of 0.6. Although the effects of spherical aberration are minimal, the loss in NILS for astigmatism, tilt, and coma are significant. FIG. 17 shows the same imaging process using the bi-level representation of the distributed-intensity four-zone illumination described in this invention. Similar results are obtained using dithered intensity circular, stepped square, and 45 degree elliptical zones. Here it can be seen that the influences of astigmatism and tilt are reduced at zero defocus values and at larger defocus values (both positive and negative) the influences of all aberrations are reduced substantially, as compared to the case shown in FIG. 16.

Implementation of the invention into existing illumination systems is accomplished via access to the illumination optical system. In one embodiment, pixilated half-tone illumination files are transferred lithographically onto a transparent substrate, such as fused silica, coated with a suitably opaque masking layer, such as chromium. A photoresist film coated over the metal coated transparent substrate is exposed using optical, electron beam, or other methods by translating the bi-level illumination representation into a suitable machine-readable format. Photoresist development and subsequent etching of the underlying masking film allows transfer of the pattern to the masking aperture. An anti-reflective layer can be coated over the masking film prior to photoresist coating, exposure, and processing to reduce reflection, stray light, and flare effects in the illumination field of the exposure tool. An anti-reflective layer can be coated over the patterned aperture to match reflectances over the entire illumination field. Alignment of apertures is made possible by incorporating alignment fiducials on the masking apertures and on an aperture holders used to mount the invention into the exposure tool illumination system. Apertures can be inserted into as pupil plane of the illumination system.

Figure 25:
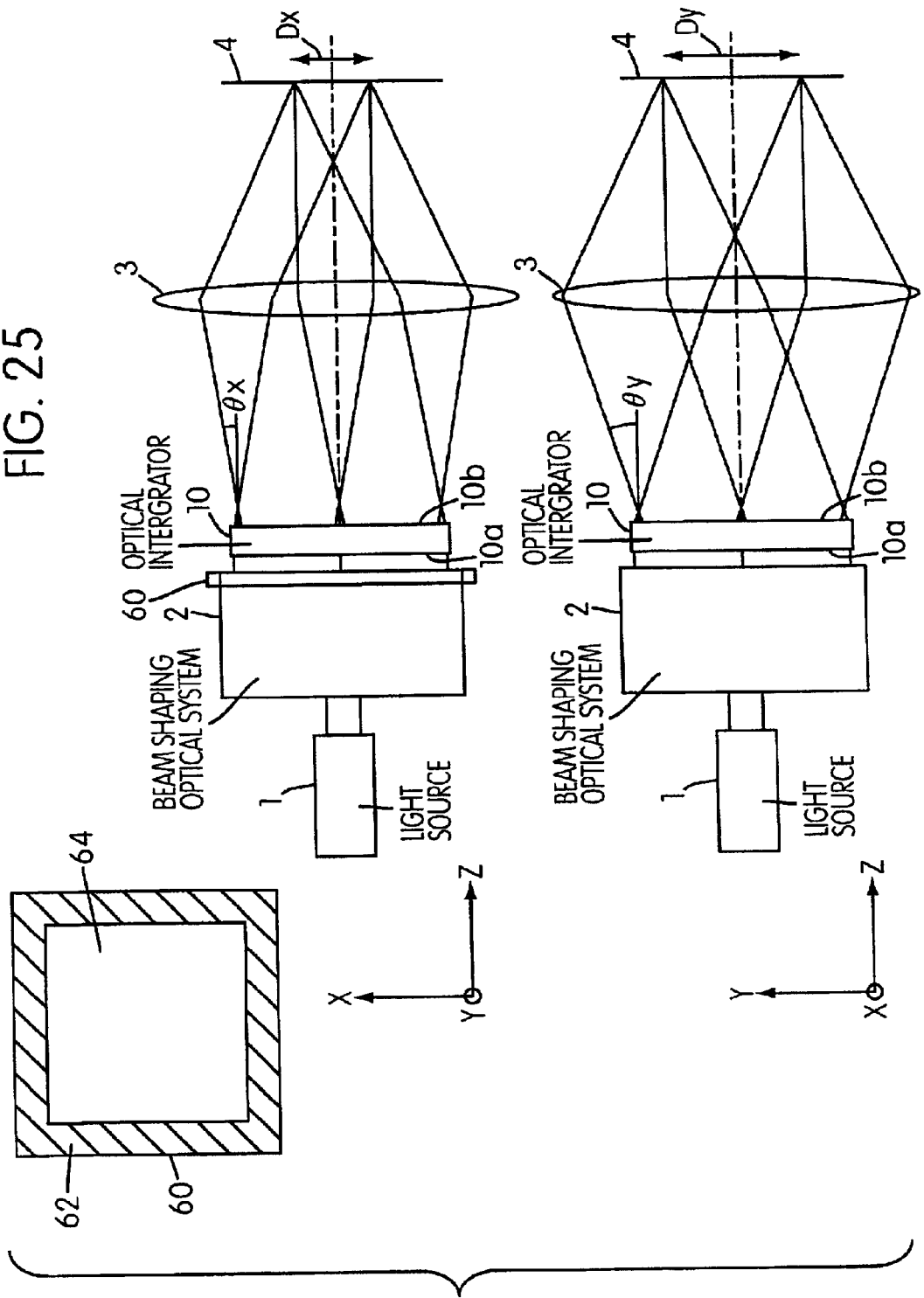
FIG. 25 is an illumination system using diffractive optical elements and a square aperture.

Those skilled in the art will understand that a number of the new results achieved with the above-described aperture mask may also be achieved with a traditional beamsplitter illumination system. For example, consider an illumination system such as the one shown and described in U. S. Pat. No. 5,627,625. When an aperture mask 60 with a large, central square opening 64 and an opaque border 62 is inserted proximate to the fly's eye or in the lens pupil 19, the four beams from the beam splitter 16 generate contour and three dimensional plots similar to FIGS. 18 and 19. The beams fill the corners of the illumination pupil and limit the non-optimal frequency spreading character along the x and y axes while optimizing the off-axis illumination angles. The new results can also be achieved with an illumination system using diffractive optical elements (DOEs) to shape the illumination profile. An example of this illumination shaping method is described, for instance, in U.S. Pat. No. 5,926,257 (Canon) and U.S. Pat. No. 5,631,721 (SVGL). FIG. 25 shows how an aperture (60) with a large, central square opening (64) and an opaque border (62) is inserted proximate to the beam shaping optical system (2). This can allow for shaping with a square limiting zone. Additionally, the beam shaping optical system using diffractive optical elements can be tailored to produce similar results. That is especially helpful for imaging features that are oriented along x and y directions in the mask plane. The use of a central obscuration (square and also round shaped) can similarly be achieved and can lead to performance improvements described here. Furthermore, any combination of off-axis illumination with a square aperture or obscuration has potential to improve performance for geometry oriented in the x-y direction. This can include, but is not limited to, round zones, elliptical zones, square zones, and annular slots (that is an annular ring masked off on x and y axis to form arc-shaped zones).

The masking aperture described above may be used alone or in combination with prior art techniques and apparatus. For example, the masking aperture of the invention may be combined with the four hole metal mask described in JP patent Laid-Open (KOKAI) Publication No. 4-267515 and discussed in the background of U.S. Pat. No. 5,627,625.

Figure 20:
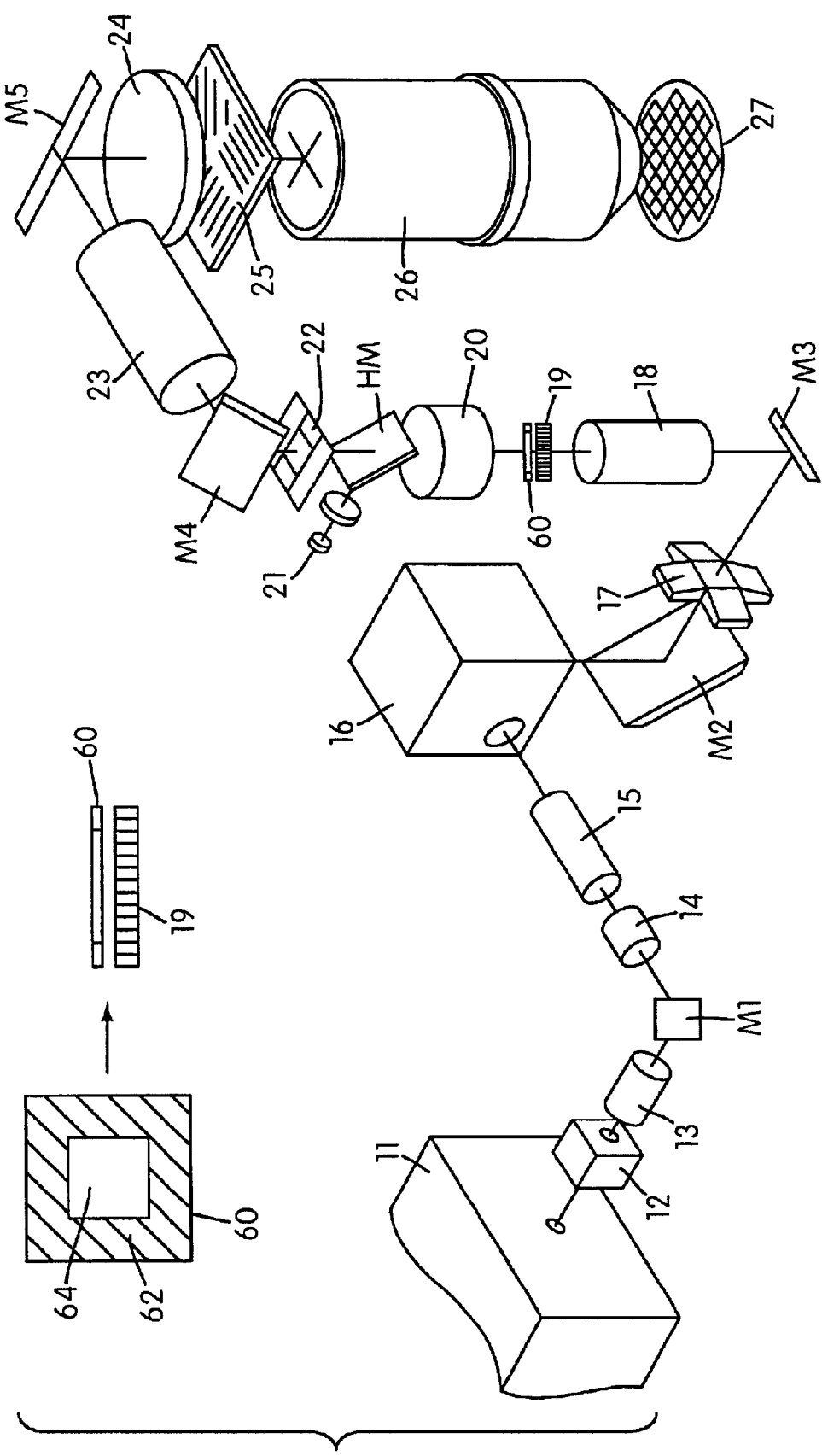
FIG. 20 is a perspective view of a beamsplitter illumination system with a square aperture mask inserted in its pupil.

Those skilled in the art will understand that the new results achieved with elliptical, 45 degree elliptical, square rings, and square shaped zones may also be achieved with alternative approaches, including the beamsplitter approach. This could be accomplished for example with the illumination system shown in FIG. 20 (and described in U.S. Pat. No. 5,627,625) by shaping divided beams into elliptical, 45 degree elliptical, and square shapes in the beamsplitter unit 16 and superposing them using a prism unit 17. Gaussian or similar shaped energy distribution is possible.

Those skilled in the art will also understand that the new results achieved with elliptical, 45 degree elliptical, square rings, and square shaped zone may so be achieved with diffractive optical element approaches to beam shaping, such as that described in U.S. Pat. No. 5,926,257 and U.S. Pat. No. 5,631,721 by tailoring the diffractive optical elements to exhibit these characteristics. The micro-diffractive optical elements within the beam-shaping optical system (2) in FIG. 25 are manipulated to allow for the required shaping. It is well known that diffractive optical elements (DOEs) and holographic optical elements (HOEs) can allow for efficient manipulation of arbitrary wavefronts with more flexibility and reduced fabrication requirements compared to conventional refractive optics (see for instance Z. Yang and K. Rosenbruch. SPIE Vol. 1354, (1990), 323). One DOE or HOE or the combination of two or more DOEs or HOEs allow for the design flexibility needed to achieve the desired results, as demonstrated for instance in U.S. Pat. No. 5,926,257 and in SPIE Vol. 1354, (1990), 323.

The present invention is described above but it is to be understood that it is not limited to these descriptive examples. The numerical values, number of zones, shapes, and limiting zones may be changed to accommodate specific conditions of masking, aberration, feature orientation, duty ratio requirements, lens parameters, initial illumination non-uniformities, and the like as required to achieve high integrated circuit pattern resolution. Results can also be obtained by controlling illumination at any Fourier Transform plan in the illumination system.

What is claimed:

1. A masking aperture for an illumination system to provide controlled illumination of a photomask with two dimensional features comprising:

a translucent substrate;

a half-tone dithered image on the substrate, said half-tone dithered image comprising an array of pixels arranged in accordance with features on said photomask to be illuminated, wherein each pixel is a clear or opaque type, said clear and opaque pixels for respectively passing and blocking incident light, wherein the number, size, and type of the pixels are chosen in accordance with:
(a) the wavelength of light used to illuminate the photomask, and
(b) the size and shape of the features of the photomask.

2. A masking aperture for an illumination system to provide controlled illumination of a photomask with two dimensional features comprising:
a translucent substrate;
a half-tone dithered pattern on the substrate, said halt-tone dithered pattern comprising an array of pixels arranged in accordance with features on said photomask to be illuminated,
wherein the half-tone dithered pattern comprises an array of diffraction elements and each diffraction element is a dithered image of clear or opaque pixels.

3. The masking aperture of claim 2, wherein each diffraction element comprises an n×n dithered matrix of pixels, the intensity or each element is defined by the number and type of pixels in its dithered matrix and wherein the pixels in each matrix are dithered to avoid artifacts.

4. The masking aperture of claim 2, wherein the relative intensity of each element is defined by a recursion relationship where:

$$D^n = \begin{vmatrix} 4D^{n/2} + D_{00}^2 U^{n/2} & 4D^{n/2} + D_{01}^2 U^{n/2} \\ 4D^{n/2} + D_{10}^2 U^{n/2} & 4D^{n/2} + D_{11}^2 U^{n/2} \end{vmatrix}$$

where:

$$U^n = \begin{vmatrix} 1 & 1 & \cdots & 1 \\ 1 & & & \\ \vdots & & & \\ 1 & & & \end{vmatrix}.$$

5. The masking aperture of clam 4, wherein the matrix of pixels of each element comprises an 8×8 matrix and the relative intensity, $D^8$, comprises:

$$D^8 = \begin{vmatrix} 0 & 32 & 8 & 40 & 2 & 34 & 10 & 42 \\ 48 & 16 & 56 & 24 & 50 & 18 & 58 & 26 \\ 12 & 44 & 4 & 36 & 14 & 46 & 6 & 38 \\ 60 & 28 & 52 & 20 & 62 & 30 & 54 & 22 \\ 3 & 35 & 11 & 43 & 1 & 33 & 9 & 41 \\ 51 & 19 & 59 & 27 & 49 & 17 & 57 & 25 \\ 15 & 47 & 7 & 39 & 13 & 45 & 5 & 37 \\ 63 & 31 & 55 & 23 & 61 & 29 & 53 & 21 \end{vmatrix}.$$

6. The masking aperture of claim 3, wherein the matrix of the diffracting elements is selected from the group consisting of 2×2, 4×4, 8×8, 16×16, 32×32 and 64×65.

7. The masking aperture of claim 2, wherein the elements generate one or more zones of controlled intensity.

8. The masking aperture of claim 7, wherein the zones are symmetrical about the center of the masking aperture.

9. The masking aperture of claim 8, wherein the zones have one shape selected from the group consisting of circles, squares, rectangles, and ellipses, rings, circular rings, square rings, or combinations thereof.

10. The masking aperture of claim 9, the selected shape is a stepped square.

11. The masking aperture of claim 9, the selected shape is an ellipse and the major axis of each ellipse is aligned at a 45-degree angle with respect to the center of the masking aperture.

12. A masking aperture for an illumination system to provide controlled illumination of a photomask with two dimensional features, comprising:
a translucent substrate;
an array of diffraction elements on the substrate and each diffraction element comprising a half-tone dithered image of clear and opaque pixels;
each half-tone image comprising an array of pixels, etch pixel of a clear or opaque type of respectively passing or blocking incident light, wherein the number, size, and type of the pixels are chosen in accordance with:
(a) the wavelength of light used to illuminate the photomask, and
(b) the size and shape of the features of the photomask, for generating a continuous illumination intensity pattern on the photomask with illumination intensity at any location controlled by the half-tone dithered image.

13. The masking aperture of claim 7, comprising a zone with a square ring.

14. The masking aperture of claim 13, wherein the zone comprises four translucent slots.

15. The masking aperture of claim 13, wherein the intensity in the square ring varies from 0% to 100%.

16. The masking aperture of claim 13, wherein the intensity outside the square ring varies from 0% to 99%.

17. The masking aperture of claim 13, wherein the square ring is combined with one or more zones having a shape selected from the group consisting of square, elliptical, ring, square ring, circular ring, or combinations thereof.

18. The masking aperture of claim 7, wherein the zones comprise an annular ring and one or more zones with shapes selected from the group of shapes consisting of square, elliptical, ring, square ring, circular ring and combinations thereof.

19. The masking aperture according to claim 1, wherein said array of pixels is arranged to cause radiation that passes through a center of said masking aperture to be attenuated more strongly than radiation that passes through a peripheral portion thereof.

20. The masking aperture according to claim 1, wherein said array of pixels comprises a first plurality of pixels that are substantially transparent to illumination radiation of said illumination system and a second plurality of pixels that at least reflect or absorb illumination radiation of said illumination system.

21. The masking aperture according to claim 20, wherein said second plurality of pixels comprise a metal deposited on said translucent substrate.

22. A masking aperture according to claim 21, wherein said metal deposited on said translucent substrate comprises chromium.

23. The masking aperture according to claim 22, wherein said translucent substrate comprises fused silica.

24. A masking aperture for an illumination system to provide controlled illumination of photomask with two dimensional features comprising:
a translucent substrate:
a half-tone dithered pattern on the substrate, said half-tone dithered pattern comprising an array of pixels arranged in accordance with features on said photomask to be illuminated; and
an anti-reflection film deposited over at least one of said translucent substrate and said half-tone dithered pattern.

* * * * *